United States Patent
Park et al.

(10) Patent No.: US 11,315,935 B2
(45) Date of Patent: Apr. 26, 2022

(54) SEMICONDUCTOR MEMORY DEVICE HAVING THREE-DIMENSIONAL STRUCTURE AND METHOD FOR MANUFACTURING THE SAME

(71) Applicant: SK hynix Inc., Icheon-si (KR)

(72) Inventors: Tae Sung Park, Icheon-si (KR); Sung Lae Oh, Cheongju-si (KR); Dong Hyuk Kim, Seoul (KR); Soo Nam Jung, Seoul (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/810,813

(22) Filed: Mar. 5, 2020

(65) Prior Publication Data

US 2021/0066313 A1 Mar. 4, 2021

(30) Foreign Application Priority Data

Sep. 3, 2019 (KR) .................. 10-2019-0109029

(51) Int. Cl.
| | |
|---|---|
| *H01L 27/11* | (2006.01) |
| *H01L 27/11582* | (2017.01) |
| *H01L 27/11551* | (2017.01) |
| *H01L 27/108* | (2006.01) |
| *H01L 27/11543* | (2017.01) |
| *H01L 27/112* | (2006.01) |

(52) U.S. Cl.
CPC .... *H01L 27/1116* (2013.01); *H01L 27/10835* (2013.01); *H01L 27/11273* (2013.01); *H01L 27/11543* (2013.01); *H01L 27/11551* (2013.01); *H01L 27/11582* (2013.01)

(58) Field of Classification Search
None
See application file for complete search history.

(56) References Cited

U.S. PATENT DOCUMENTS

2016/0225785 A1\* 8/2016 Kim .................. H01L 27/11575
2019/0067314 A1\* 2/2019 Lu ..................... H01L 27/11556

FOREIGN PATENT DOCUMENTS

KR 10-2020-0103484 A 9/2020

\* cited by examiner

*Primary Examiner* — Anthony Ho
*Assistant Examiner* — Kevin Quinto

(57) ABSTRACT

A semiconductor memory device includes a stack disposed over a first substrate; an etch barrier including a plurality of dummy channels which pass through the stack and surround a coupling region; and a plurality of channels passing through the stack in a cell region outside the coupling region. The stack has a structure in which first dielectric layers and second dielectric layers are alternately stacked, inside the coupling region, and has a structure in which the first dielectric layers and electrode layers are alternately stacked, outside the coupling region.

20 Claims, 27 Drawing Sheets d1 > d2, A1 ≒ A2

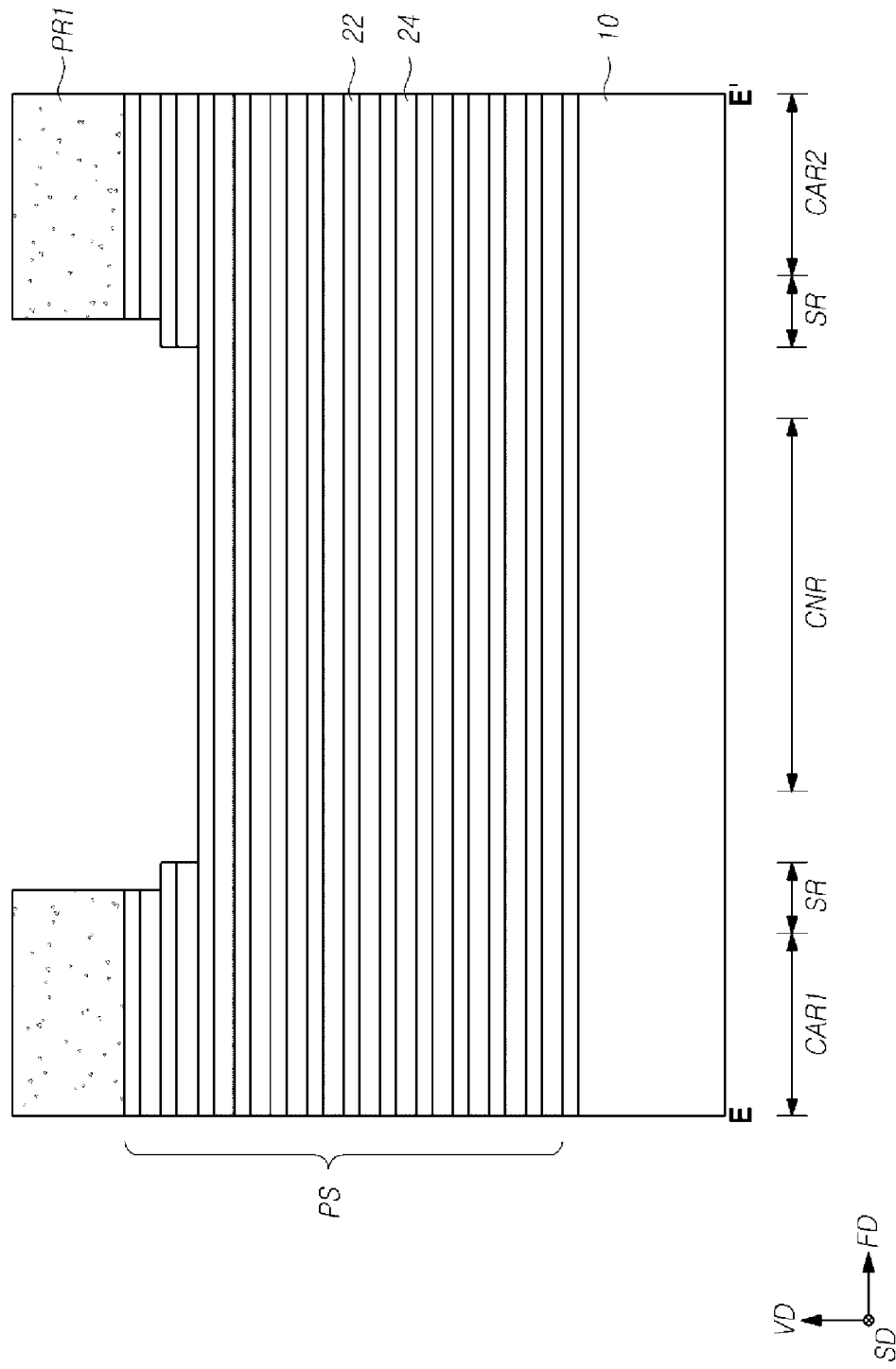

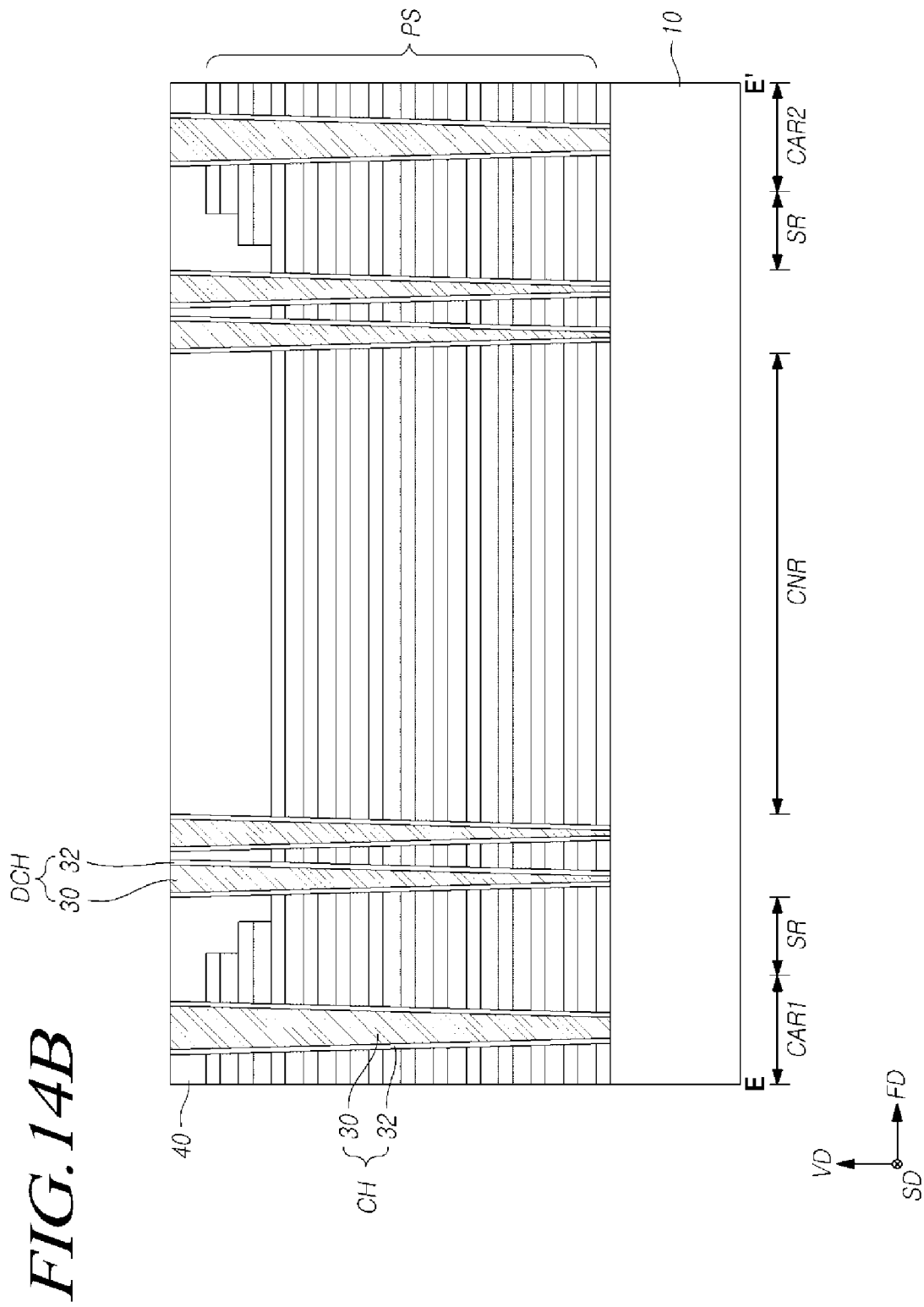

SEMICONDUCTOR MEMORY DEVICE HAVING THREE-DIMENSIONAL STRUCTURE AND METHOD FOR MANUFACTURING THE SAME

CROSS-REFERENCE TO RELATED APPLICATION

The present application claims priority under 35 U.S.C. § 119(a) to Korean Patent Application No. 10-2019-0109029 filed in the Korean Intellectual Property Office on Sep. 3, 2019, which is incorporated herein by reference in its entirety.

BACKGROUND

1. Technical Field

Various embodiments generally relate to a semiconductor memory device, and particularly, to a semiconductor memory device having a three-dimensional structure (3D) and a method for manufacturing the same.

2. Related Art

In order to meet the excellent performance and low price that consumers demand, the degree of integration of a semiconductor device needs to increase. Because the degree of integration of a two-dimensional (2D) or a planar semiconductor memory device is mainly determined by the area occupied by a unit memory cell, the degree of integration is greatly influenced by the level of a fine pattern forming technique. However, since highly expensive equipment is required for the formation of a fine pattern, the degree of integration of a two-dimensional semiconductor memory device is still limited, although it is being increased. As an alternative to overcome such a limitation, a semiconductor memory device having a three-dimensional structure including three-dimensionally arranged memory cells has been proposed.

SUMMARY

Various embodiments are directed to a semiconductor memory device capable of simplifying a manufacturing process and reducing defects occurred during the manufacturing process.

Also, various embodiments are directed to a method for manufacturing the semiconductor memory device described above.

In an embodiment, a semiconductor memory device may include: a stack disposed over a first substrate; an etch barrier including a plurality of dummy channels which pass through the stack and surround a coupling region; and a plurality of channels passing through the stack in a cell region outside the coupling region. The stack comprises first dielectric layers and second dielectric layers alternately stacked, inside the coupling region, and comprises the first dielectric layers and electrode layers are alternately stacked, outside the coupling region.

In an embodiment, a semiconductor memory device may include: a stack disposed over a first substrate which is defined with a cell region and a coupling region; a plurality of channels passing through the stack in the cell region; and a plurality of dummy channels passing through the stack at a periphery of the coupling region. An interval between the dummy channels may be smaller than an interval between the channels. The stack may include: a plurality of first dielectric layers stacked over the first substrate to be separated from one another; second dielectric layers stacked alternately with the first dielectric layers inside the coupling region; and electrode layers stacked alternately with the first dielectric layers outside the coupling region.

In an embodiment, a method for manufacturing a semiconductor memory device may include: forming a pre-stack by alternately stacking a plurality of first dielectric layers and a plurality of second dielectric layers over a substrate that includes a cell region and a coupling region; forming a plurality of channel holes in the cell region and forming a plurality of dummy channel holes separated from one another with an interval smaller than an interval between the channel holes, at a periphery of the coupling region; forming a plurality of channels in the plurality of channel holes, and forming a plurality of dummy channels in the plurality of dummy channel holes; removing the second dielectric layers by using the plurality of dummy channels as an etch barrier such that the plurality of second dielectric layers inside the coupling region remain and the plurality of second dielectric layers outside the coupling region are removed; and forming electrode layers in spaces from which the plurality of second dielectric layers are removed outside the coupling region.

BRIEF DESCRIPTION OF THE DRAWINGS

FIGS. 11A to 16A are examples of top views to assist in the explanation of a method for manufacturing a semiconductor memory device in accordance with an embodiment of the disclosure, according to a manufacturing sequence.

FIGS. 11B to 16B are cross-sectional views taken along the lines E-E' of FIGS. 11A to 16A, respectively.

DETAILED DESCRIPTION

Figure 1:
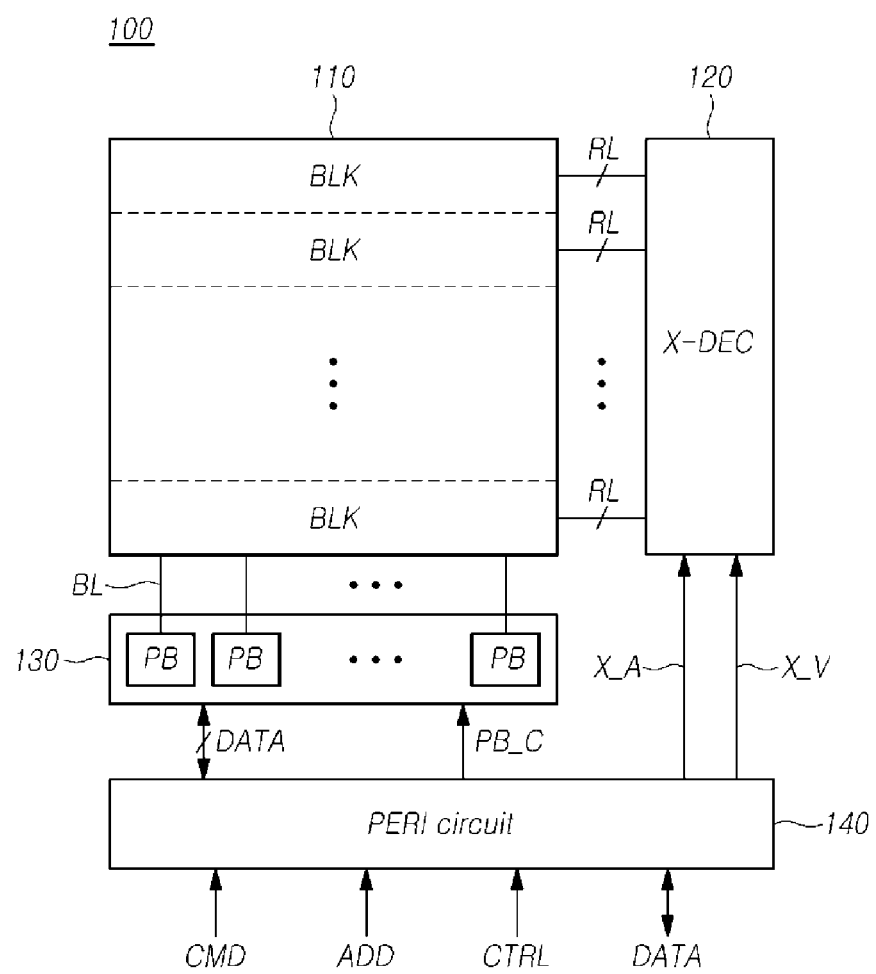
FIG. 1 is a block diagram illustrating an example of a semiconductor memory device in accordance with an embodiment of the disclosure.

Advantages and features of the disclosure and methods to achieve them will become apparent from the descriptions of exemplary embodiments herein below and described with reference to the accompanying drawings. However, the present disclosure is not limited to the exemplary embodiments disclosed herein but may be implemented in various different ways. The exemplary embodiments of the present disclosure convey the scope of the disclosure to those skilled in the art.

The figures, dimensions, ratios, angles, numbers of elements given in the drawings that describe embodiments of the disclosure are merely illustrative and are not limiting. Throughout the specification, like reference numerals refer to like elements. In describing the disclosure, when it is determined that a detailed description of the known related art may obscure the gist or clarity of the disclosure, the detailed description thereof will be omitted. It is to be understood that the terms "comprising," "having," "including" and so on, used in the description and claims, should not be interpreted as being restricted to the means listed thereafter unless specifically stated otherwise. Where an indefinite or definite article is used when referring to a singular noun (e.g. "a," "an," "the"), the article may include a plural of that noun unless specifically stated otherwise.

Elements in embodiments of the disclosure should be interpreted as including error margins even in the absence of explicit statements.

Also, in describing the components of the disclosure, there may be terms used like first, second, A, B, (a), and (b). These are solely for the purpose of differentiating one component from the other and do not to imply or suggest the substances, order, sequence or number of the components. If a component is described as "connected," "coupled" or "linked" to another component, it may mean that the component is not only directly "connected," "coupled" or "linked" but also is indirectly "connected," "coupled" or "linked" via a third component. In describing positional relationship, such as "an element A on an element B," "an element A above an element B," "an element A below an element B" and "an element A next to an element B," another element C may be disposed between the elements A and B unless the term "directly" or "immediately" is explicitly used.

Also, elements in embodiments of the disclosure are not limited by these terms. These terms are used to merely distinguish one element from another. Accordingly, as used herein, a first element may be a second element within the technical idea of the disclosure.

Features of various exemplary embodiments of the disclosure may be coupled, combined or separated partially or totally. Technically various interactions and operations are possible. Various exemplary embodiments can be practiced individually or in combination.

Hereinafter, a semiconductor memory device having a three-dimensional structure and a method for manufacturing the same will be described below in detail with reference to the accompanying drawings through various examples of embodiments of the disclosure.

FIG. 1 is a block diagram illustrating a representation of an example of a semiconductor memory device in accordance with an embodiment of the disclosure.

Referring to FIG. 1, a semiconductor memory device 100 in accordance with an embodiment of the disclosure may include a memory cell array 110, a row decoder (X-DEC) 120, a page buffer circuit 130 and a peripheral circuit (PERI circuit) 140.

The memory cell array 110 may include a plurality of memory blocks BLK. While not illustrated, each of the memory blocks BLK may include a plurality of cell strings. Each cell string may include at least one drain select transistor, a plurality of memory cells and at least one source select transistor, all coupled together in series. Each memory cell may be a volatile memory cell or may be a nonvolatile memory cell. While the descriptions below use a vertical NAND flash device as an example of the semiconductor memory device 100, it is to be understood that the technical spirit of the present disclosure is not limited thereto.

The memory cell array 110 may be coupled to the row decoder 120 through row lines RL. The row lines RL may include at least one drain select line, a plurality of word lines and at least one source select line. The memory cell array 110 may be coupled to the page buffer circuit 130 through bit lines BL.

The row decoder 120 may select any one among the memory blocks BLK included in the memory cell array 110, in response to a row address X_A provided from the peripheral circuit 140. The row decoder 120 may transfer an operating voltage X_V, provided from the peripheral circuit 140, to row lines RL coupled to a memory block BLK selected among the memory blocks BLK included in the memory cell array 110.

The page buffer circuit 130 may include a plurality of page buffers PB which are coupled to the bit lines BL, respectively. The page buffer circuit 130 may receive a page buffer control signal PB_C from the peripheral circuit 140, and may transmit and receive a data signal DATA to and from the peripheral circuit 140. The page buffer circuit 130 may control the bit lines BL, which are arranged in the memory cell array 110, in response to the page buffer control signal PB_C. For example, the page buffer circuit 130 may detect data stored in a memory cell of the memory cell array 110 by sensing the signal of a bit line BL of the memory cell array 110 in response to the page buffer control signal PB_C, and may transmit the data signal DATA to the peripheral circuit 140 depending on the detected data. The page buffer circuit 130 may apply a signal to a bit line BL based on the data signal DATA received from the peripheral circuit 140 in response to the page buffer control signal PB_C, and thereby, may write data in a memory cell of the memory cell array 110. The page buffer circuit 130 may write or read data in or from a memory cell which is coupled to a word line activated by the row decoder 120.

The peripheral circuit 140 may receive a command signal CMD, an address signal ADD and a control signal CTRL from outside the semiconductor memory device 100, and may transmit and receive data DATA to and from a device outside the semiconductor memory device 100, for example, a memory controller. The peripheral circuit 140 may output signals for writing data in the memory cell array 110 or reading data from the memory cell array 110, for example, the row address X_A, the page buffer control signal PB_C and so forth, based on the command signal CMD, the address signal ADD and the control signal CTRL. The peripheral circuit 140 may generate various voltages including the operating voltage X_V, which are required in the semiconductor memory device 100.

Hereinbelow, in the accompanying drawings, two directions that are parallel to the top surface of a substrate and intersect with each other are defined as a first direction FD and a second direction SD, respectively, and a direction that vertically protrudes from the top surface of the substrate is defined as a vertical direction VD. For example, the first direction FD may correspond to the extending direction of word lines, and the second direction SD may correspond to the extending direction of bit lines. The first direction FD and the second direction SD may substantially perpendicularly intersect with each other. The vertical direction VD may correspond to a direction that is perpendicular to the first direction FD and the second direction SD. In the drawings, a direction indicated by an arrow and a direction opposite thereto represent the same direction.

Figure 2:
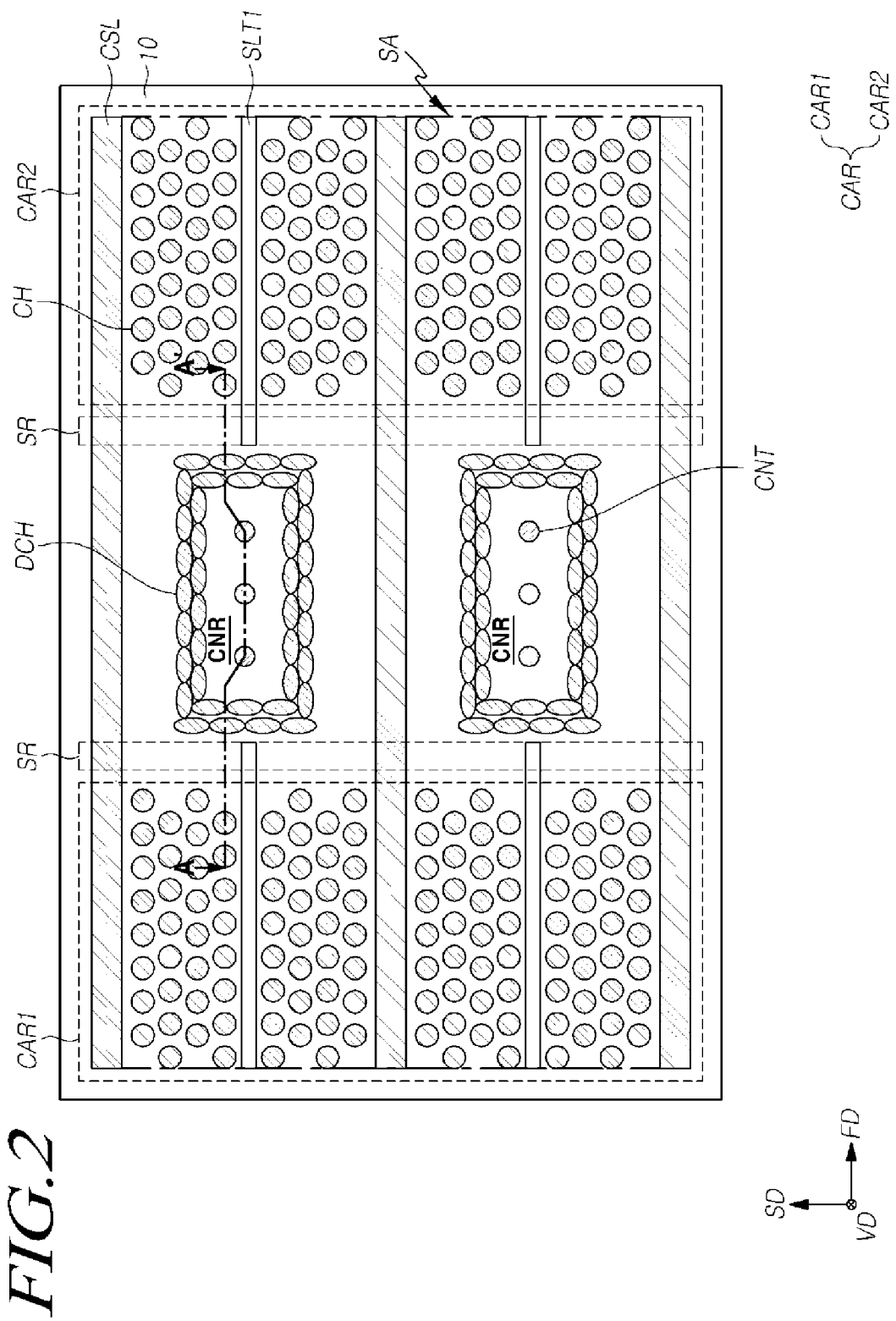
FIG. 2 is a top view illustrating an example of a portion of a semiconductor memory device in accordance with an embodiment of the disclosure.
Figure 3:
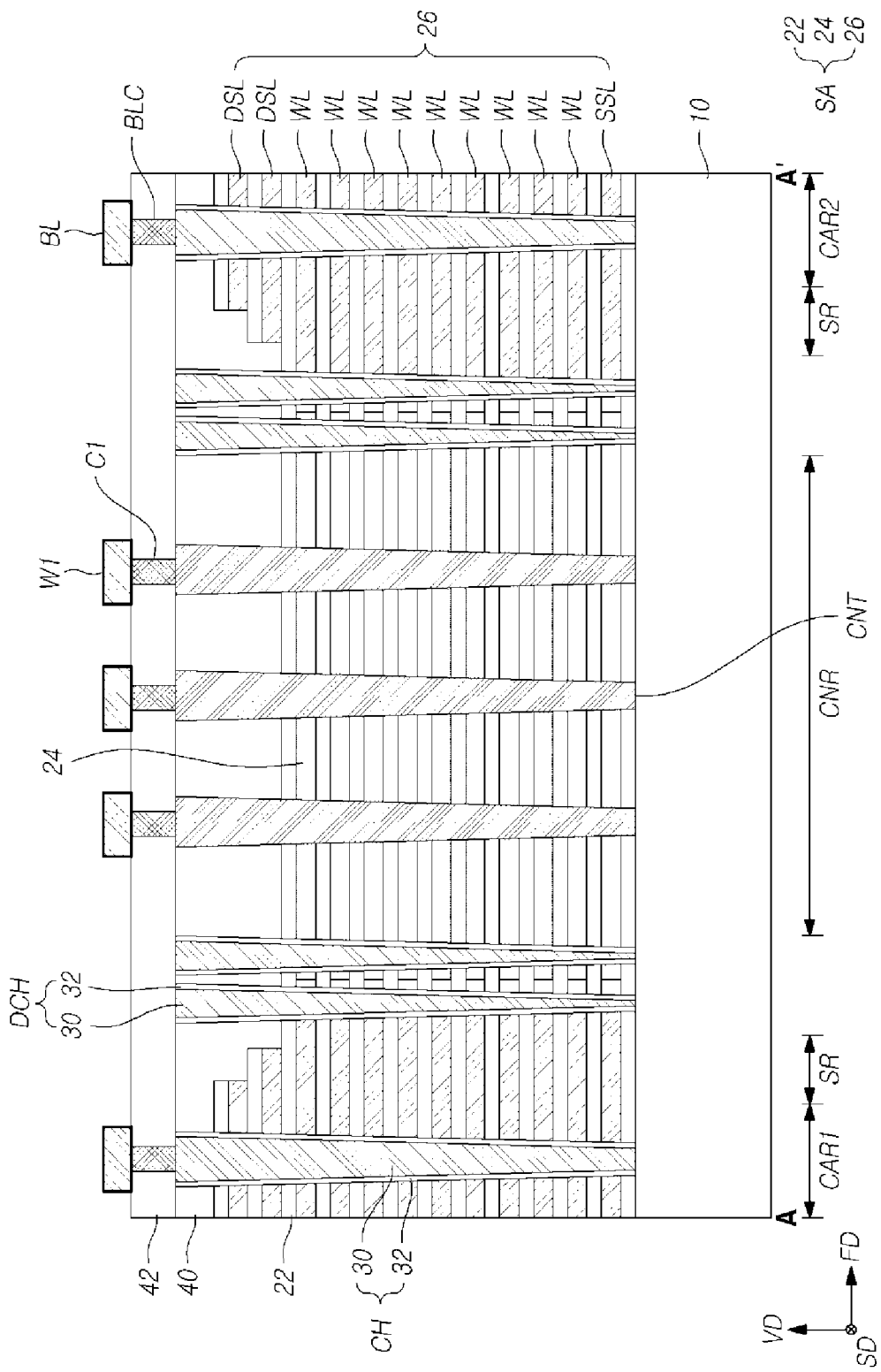
FIG. 3 is a cross-sectional view taken along the line A-A' of FIG. 2.
Figure 4:
FIG. 4 is a top view for comparing channels and dummy channels illustrated in FIG. 2.

FIG. 2 is a top view illustrating an example of a portion of a semiconductor memory device in accordance with an embodiment of the disclosure, FIG. 3 is a cross-sectional view taken along the line A-A' of FIG. 2, and FIG. 4 is a view for comparing channels and dummy channels illustrated in FIG. 2. For the sake of simplification in illustration, illustration of bit lines BL and wiring lines W1 is omitted from FIG. 2.

Referring to FIG. 2, a stack SA may be defined on a substrate 10. The substrate 10 may include a cell region CAR, step regions SR, and a coupling region CNR. The cell region CAR may include a first cell region CAR1 and a second cell region CAR2 which are disposed in the first direction FD.

A plurality of channels CH which pass through the stack SA in the vertical direction VD may be defined in the first and second cell regions CAR1 and CAR2. The channels CH may be arranged in the first direction FD and the second direction SD. The step regions SR may be disposed adjacent to the first cell region CAR1 and the second cell region CAR2, respectively. For example, one or more step regions SR may be disposed between the first cell region CAR1 and the second cell region CAR2. As will be described later with reference to FIG. 3, the stack SA may include at least one source select line, a plurality of word lines, and at least one drain select line. Although not illustrated, step structures which expose the pad regions of drain select lines of the stack SA may be defined in the step regions SR.

The coupling region CNR may be disposed between two step regions SR. The coupling region CNR may be defined as a region which is surrounded by a plurality of dummy channels DCH. The dummy channels DCH may be disposed along the periphery of the coupling region CNR, and may pass through the stack SA in the vertical direction VD.

A plurality of separation structures CSL, which pass through the stack SA in the vertical direction VD, may be defined to divide the stack SA into a plurality of blocks or/and a plurality of fingers. The separation structures CSL may extend in the first direction FD, and may be disposed in the second direction SD. Each of the separation structures CSL may include a common source line, which extends in the first direction FD, and a sidewall dielectric layer, which is disposed between the common source line and the stack SA.

In the first and second cell regions CAR1 and CAR2, and in the step regions SR, a slit SLT1 may be defined in the drain select line of the stack SA. The slit SLT1 may divide the drain select line into units smaller than the blocks or/and the fingers. Materials inside the coupling region CNR of stack SA may be different than materials outside the coupling region CNR in stack SA.

Referring to FIGS. 2 and 3, in the coupling region CNR, the stack SA may have a structure in which first dielectric layers 22 and second dielectric layers 24 are alternately stacked. The first dielectric layers 22 and the second dielectric layers 24 may be formed of different materials. For example, the first dielectric layers 22 may be formed of a dielectric material for interlayer insulation, and the second dielectric layers 24 may be formed of a dielectric material which may be used as sacrificial layers and has an etching selectivity with respect to the first dielectric layers 22. For example, the first dielectric layers 22 may be formed of silicon oxide, and the second dielectric layers 24 may be formed of silicon nitride.

Outside the coupling region CNR, the stack SA may have a structure in which the first dielectric layers 22 and electrode layers 26 are alternately stacked. The electrode layers 26 may include a conductive material. For example, the electrode layers 26 may include at least one selected among a doped semiconductor (e.g., doped silicon), a metal (e.g., tungsten, copper or aluminum), a conductive metal nitride (e.g., titanium nitride or tantalum nitride) and a transition metal (e.g., titanium or tantalum).

The electrode layers 26 may constitute the row lines RL described above with reference to FIG. 1. Among the electrode layers 26, at least one layer from the lowermost layer may constitute a source select line SSL, and at least one layer from the uppermost layer may constitute a drain select line DSL. The electrode layers 26 between the source select line SSL and the drain select line DSL may constitute word lines WL.

Referring to FIG. 3, the drain select line DSL may be disposed in the first and second cell regions CAR1 and CAR2 and the step regions SR. The drain select line DSL may extend from the first and second cell regions CAR1 and CAR2 to the step regions SR, and may form step structures in the step regions SR. The drain select line DSL may not be disposed in the region between the step regions SR.

Each of the channels CH and the dummy channels DCH may include a channel layer 30 and a gate dielectric layer 32. The channel layer 30 may include polysilicon or monocrystalline silicon, and may include a P-type impurity such as boron (B) in some areas thereof. The channel layer 30 may have the shape of a pillar whose central area is completely filled or a solid cylinder. The channel layer 30 may be tapered in the vertical direction. While not illustrated, in some embodiments the channel layer 30 may have the shape of a tube whose central area is open. In this case, a buried dielectric layer may be formed in the open central area of the channel layer 30. The gate dielectric layer 32 may have the shape of a straw or a cylindrical shell which surrounds the outer wall of the channel layer 30. While not illustrated, the gate dielectric layer 32 may include a tunnel dielectric layer, a charge storage layer and a blocking layer which are sequentially stacked from the outer wall of the channel layer 30 in an inward direction. In some embodiments, the gate dielectric layer 32 may have an ONO (oxide-nitride-oxide) stack structure in which an oxide layer, a nitride layer and an oxide layer are sequentially stacked. Source select transistors, memory cells and drain select transistors may be formed in areas or regions where the electrode layers 26 surround the channels CH.

Referring to FIGS. 2 and 4, the interval between adjacent channels CH may be a first interval d1. First interval d1 may be the smallest distance between adjacent channels CH. The interval between adjacent dummy channels DCH may be a second interval d2, and the second interval d2 is smaller than the first interval d1. Second interval d2 may be the smallest distance between adjacent dummy channels DCH. In a top view, each of the channels CH may have a first area A1, and each of the dummy channels DCH may have a second area A2. The first area A1 and the second area A2 may be substantially the same. In a top view, the channels CH and the dummy channels DCH may have an elliptical shape.

As will be described later with reference to FIGS. 11A through 16B, the first dielectric layers 22 and the second dielectric layers 24 may be alternately stacked on the substrate 10, and the second dielectric layers 24 may be removed by forming slits SLT1 and SLT2 in the first dielectric layers 22 and the second dielectric layers 24 alternately stacked and then injecting an etchant capable of removing the second dielectric layers 24, through the slits SLT1 and SLT2.

The interval between the channels CH, that is, the first interval d1, may be relatively large and sized to allow the infiltration of the etchant. The interval between the dummy channels DCH, that is, the second interval d2, may be relatively small and sized to suppress or prevent the infiltration of the etchant. The dummy channels DCH may serve as an etch barrier in a process for removing the second dielectric layers 24. Due to this fact, the second dielectric layers 24 inside the coupling region CNR surrounded by the dummy channels DCH may not be removed and remain, and the second dielectric layers 24 outside the coupling region CNR may be removed. The electrode layers 26 may be formed in spaces from which the second dielectric layers 24 are removed.

Consequently, the stack SA may have a structure in which the first dielectric layers 22 and the second dielectric layers 24 are alternately stacked inside of the coupling region CNR surrounded by the dummy channels DCH, and may have a structure in which the first dielectric layers 22 and the electrode layers 26 are alternately stacked outside of the coupling region CNR.

Referring to FIG. 3, a first interlayer dielectric layer 40 may be defined on the stack SA to cover the top and side surfaces of the stack SA and the side surfaces of the channels CH and the dummy channels DCH. The first interlayer dielectric layer 40 may be formed of silicon oxide. In the coupling region CNR, contact plugs CNT that vertically pass through the first interlayer dielectric layer 40 and the stack SA may be defined. In an embodiment, the contact plugs CNT are used to transfer a source voltage to the substrate 10. The contact plugs CNT may pass through the first interlayer dielectric layer 40 and the first and second dielectric layers 22 and 24 that are alternately stacked, and thereby may be coupled to the substrate 10 in the coupling region CNR.

A second interlayer dielectric layer 42 may be defined on the first interlayer dielectric layer 40 to cover the top surfaces of the channels CH, the dummy channels DCH and the contact plugs CNT. The second interlayer dielectric layer 42 may be formed of silicon oxide. Bit lines BL and wiring lines W1 may be disposed on the second interlayer dielectric layer 42. The bit lines BL may extend in the second direction SD in the first and second cell regions CAR1 and CAR2, and may be arranged in the first direction FD. Bit line contacts BLC, which pass through the second interlayer dielectric layer 42, may be defined under the bit lines BL, and thereby, may couple the bit lines BL and the channel layers 30 of the channels CH. Contacts C1, which pass through the second interlayer dielectric layer 42, may be defined under the wiring lines W1, and thereby, may couple the wiring lines W1 and the contact plugs CNT.

Figure 5:
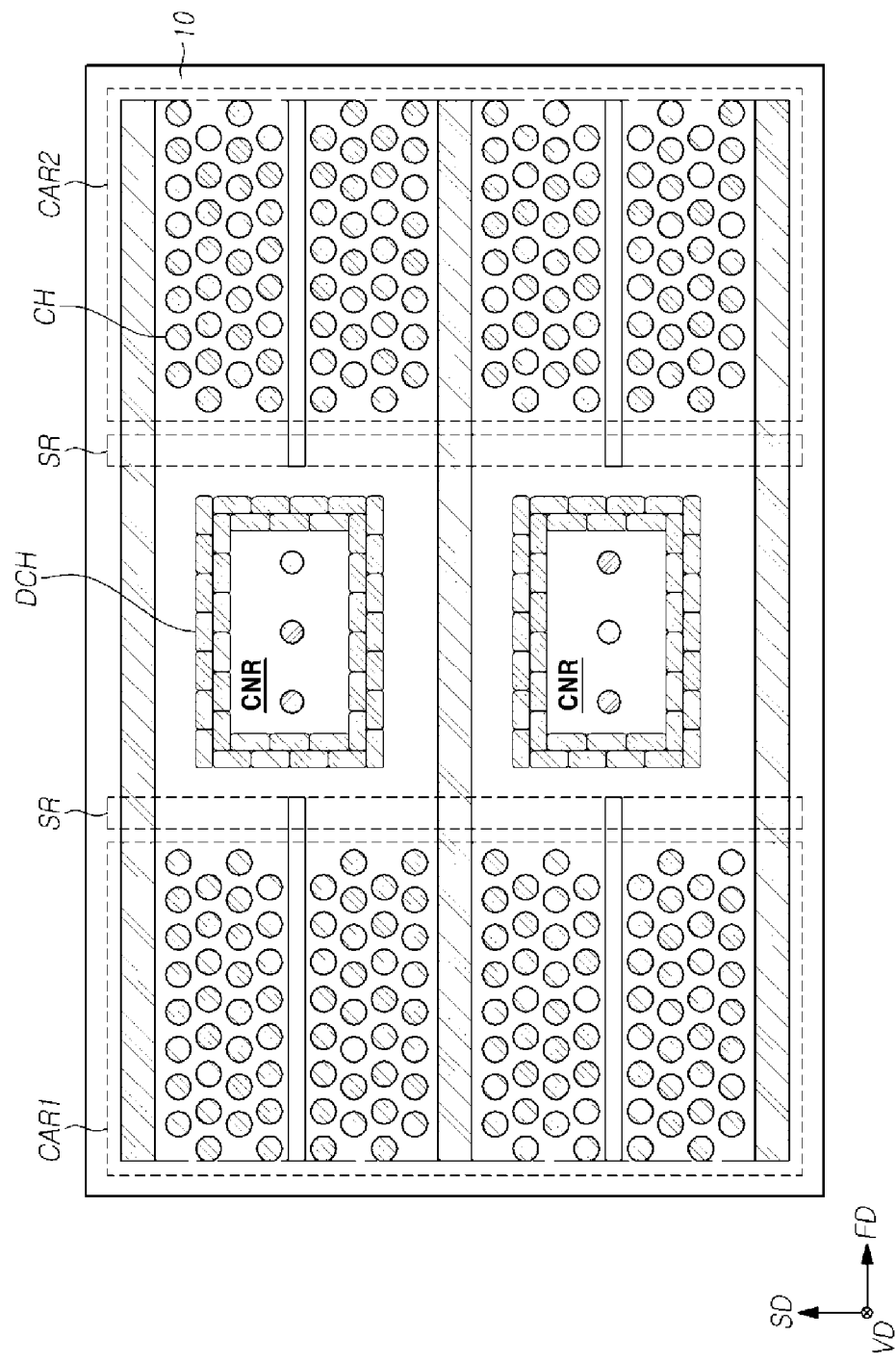
FIG. 5 is a top view illustrating an example of a semiconductor memory device in accordance with an embodiment of the disclosure.

FIG. 5 is a top view illustrating an example of a semiconductor memory device in accordance with an embodiment of the disclosure.

Referring to FIG. 5, when viewed from the top, dummy channels DCH may have a different shape from channels CH. For example, when viewed from the top, the channels CH may have an elliptical shape, and the dummy channels DCH may have a rectangular shape with rounded corners. Dummy channels DCH having a rectangular shape, when compared to dummy channels DCH with an elliptical shape, may have smaller intervals between the dummy channels DCH. Therefore, dummy channels DCH having a rectangular shape may improve suppression of the infiltration of an etchant by the dummy channels DCH into the stack SA within coupling region CNR.

Figure 6:
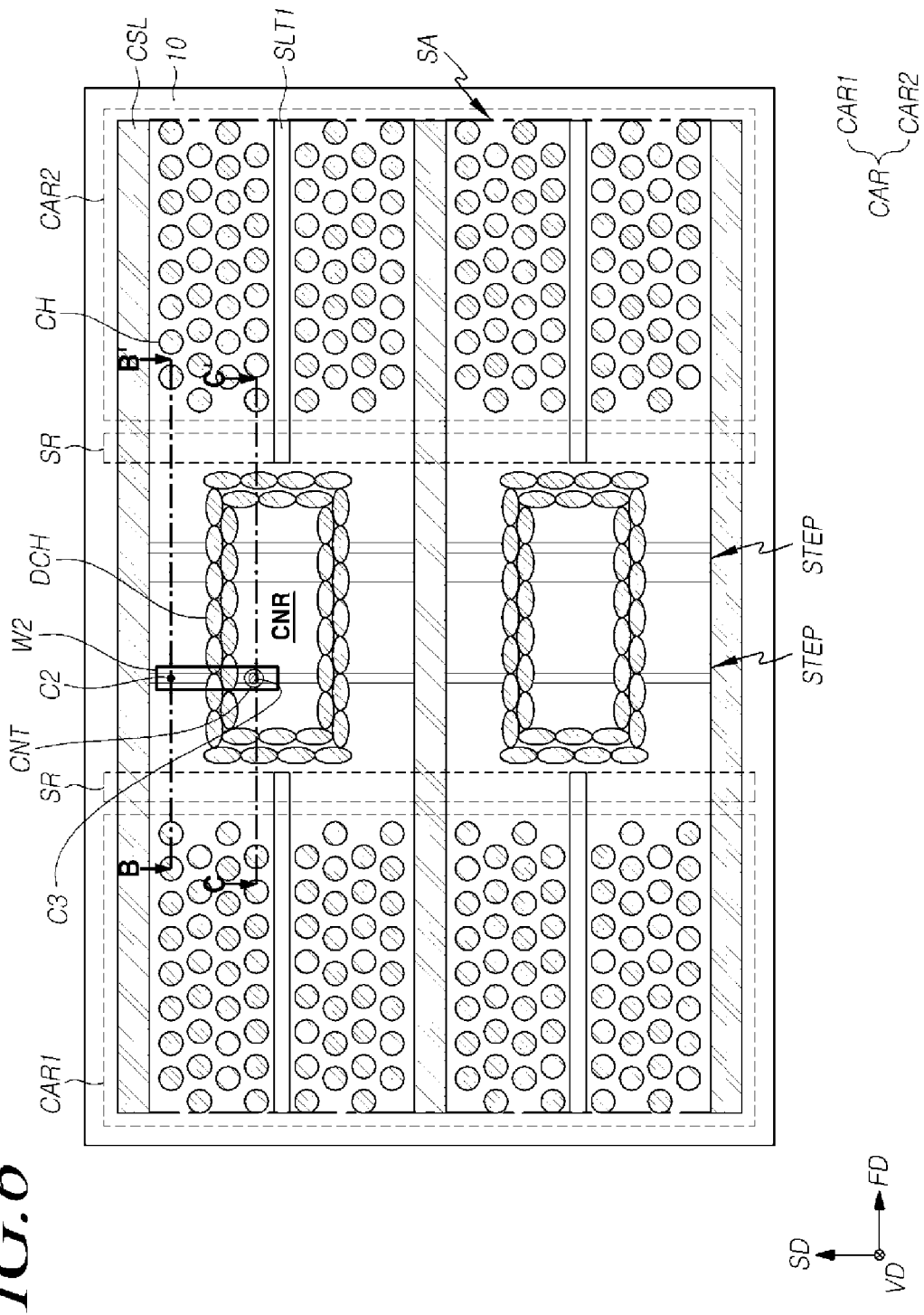
FIG. 6 is a top view illustrating an example of a semiconductor memory device in accordance with still an embodiment of the disclosure.
Figure 7A:
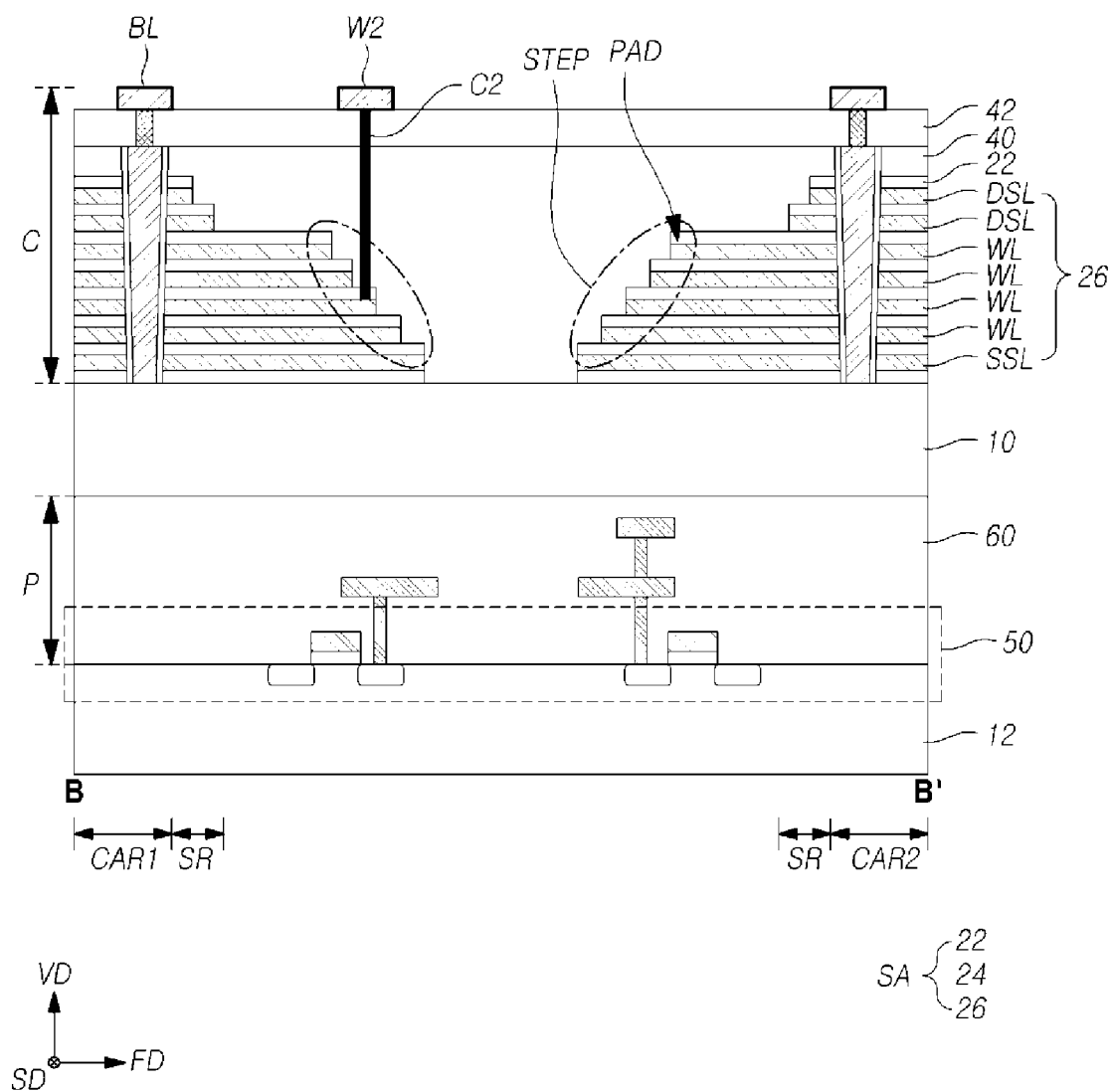
FIG. 7A is a cross-sectional view taken along the line B-B' of FIG. 6.
Figure 7B:
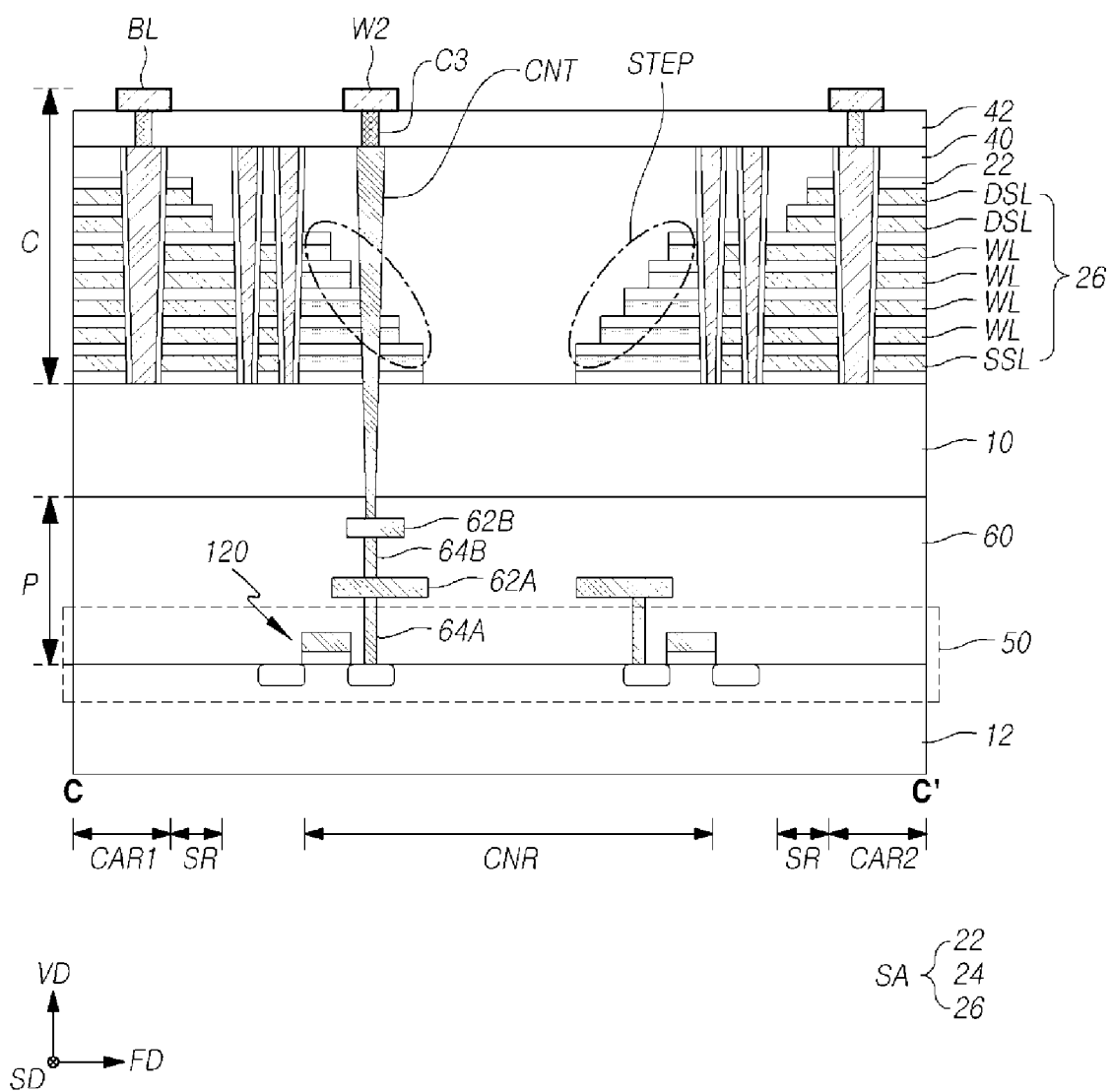
FIG. 7B is a cross-sectional view taken along the line C-C' of FIG. 6.

FIG. 6 is a top view illustrating an example of a semiconductor memory device in accordance with an embodiment of the disclosure, FIG. 7A is a cross-sectional view taken along the line B-B' of FIG. 6, and FIG. 7B is a cross-sectional view taken along the line C-C' of FIG. 6.

Referring to FIGS. 6, 7A and 7B, a semiconductor memory device may have a PUC (peri under cell) structure. A logic structure P may be disposed under a memory structure C. The logic structure P may include a logic circuit 50 which is disposed on a second substrate 12. The second substrate 12 may include at least one selected from the group including a monocrystalline silicon layer, an SOI (silicon on insulator), a silicon layer formed on a silicon germanium (SiGe) layer, a monocrystalline silicon layer formed on a dielectric layer and a polysilicon layer formed on a dielectric layer. The logic circuit 50 may include a row decoder 120 which is defined on the second substrate 12. FIGS. 6 through 7B illustrate a case where at least one of each of a drain select line DSL, word lines WL and a source select line SSL defined in the memory structure C is coupled to the row decoder 120 defined in the logic structure P.

An interlayer dielectric layer 60 may be defined on the second substrate 12, and thereby, may cover the logic circuit 50. A wiring line 62B may be disposed in the interlayer dielectric layer 60. The wiring line 62B may be coupled to the row decoder 120 through contacts 64A and 64B and a wiring line 62A.

Step structures STEP may be defined in a stack SA between step regions SR. Referring to FIGS. 6 and 7A, outside a coupling region CNR, the word lines WL and the source select line SSL of the stack SA may have pad regions PAD which are exposed by the step structures STEP.

A contact C2 may be coupled to each of the pad regions PAD of the drain select line DSL, the word lines WL and the source select line SSL of the memory structure C. For example in FIG. 7A, outside of the coupling region CNR, the contact C2 may be coupled to one of the pad regions PAD of a word line WL through second and first interlayer dielectric layers 42 and 40. A wiring line W2 may be defined on the second interlayer dielectric layer 42, and thereby, may be coupled with the contact C2. For the sake of simplicity in illustration, only one contact C2 and only one wiring line W2 are illustrated, but it is to be understood that a contact C2 and a wiring line W2 are provided for each of the drain select line DSL, the word lines WL and the source select line SSL.

Referring to FIGS. 6 and 7B, in the coupling region CNR, a contact plug CNT may be coupled to the wiring line 62B of the logic structure P through the first interlayer dielectric layer 40, alternately stacked first and second dielectric layers 22 and 24, and a substrate 10. The contact plug CNT may configure an electrical path which couples one of the drain select line DSL, the word lines WL and the source select line SSL of the memory structure C and the row decoder 120 of the logic structure P.

Figure 8:
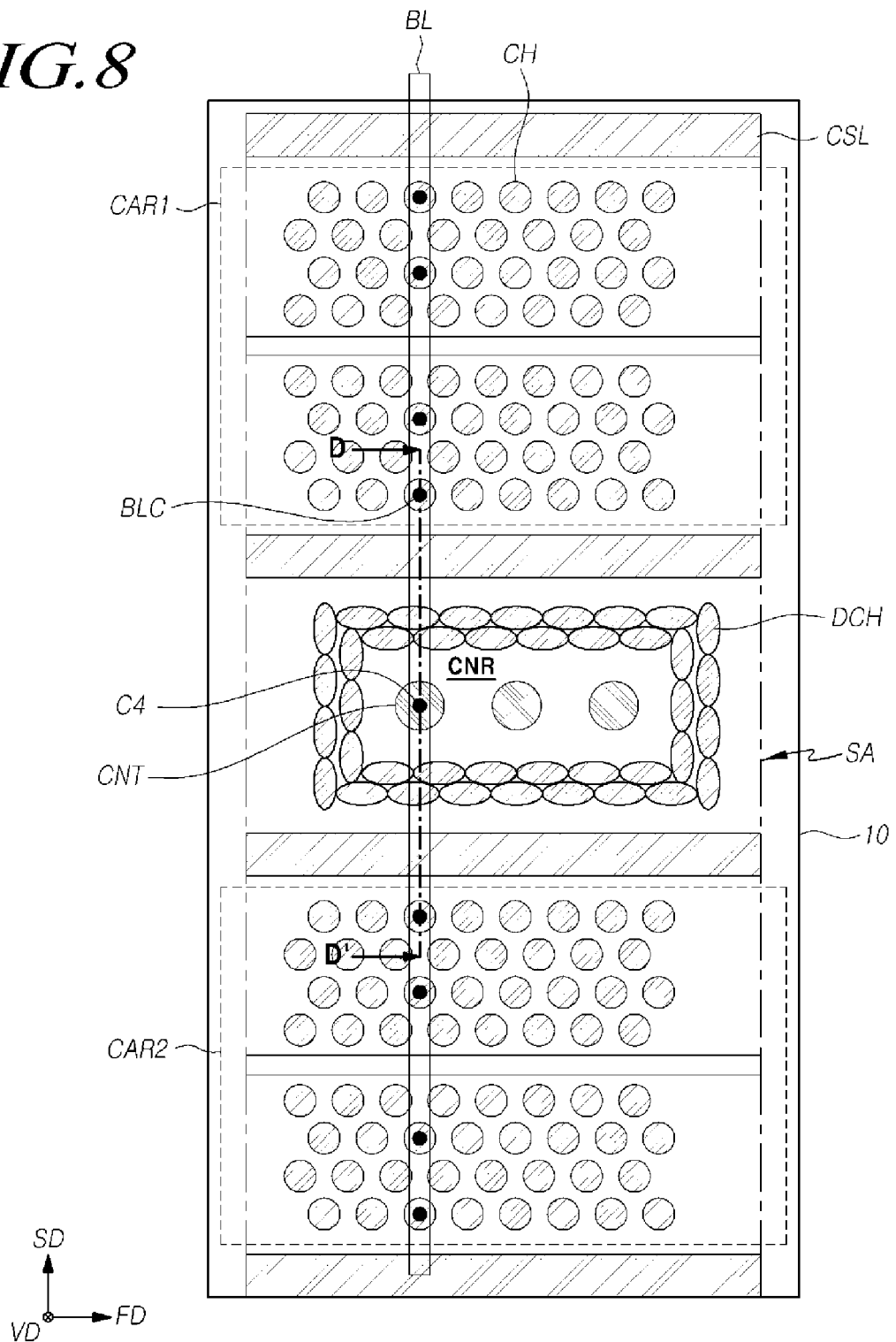
FIG. 8 is a top view illustrating an example of a semiconductor memory device in accordance with an embodiment of the disclosure.
Figure 9:
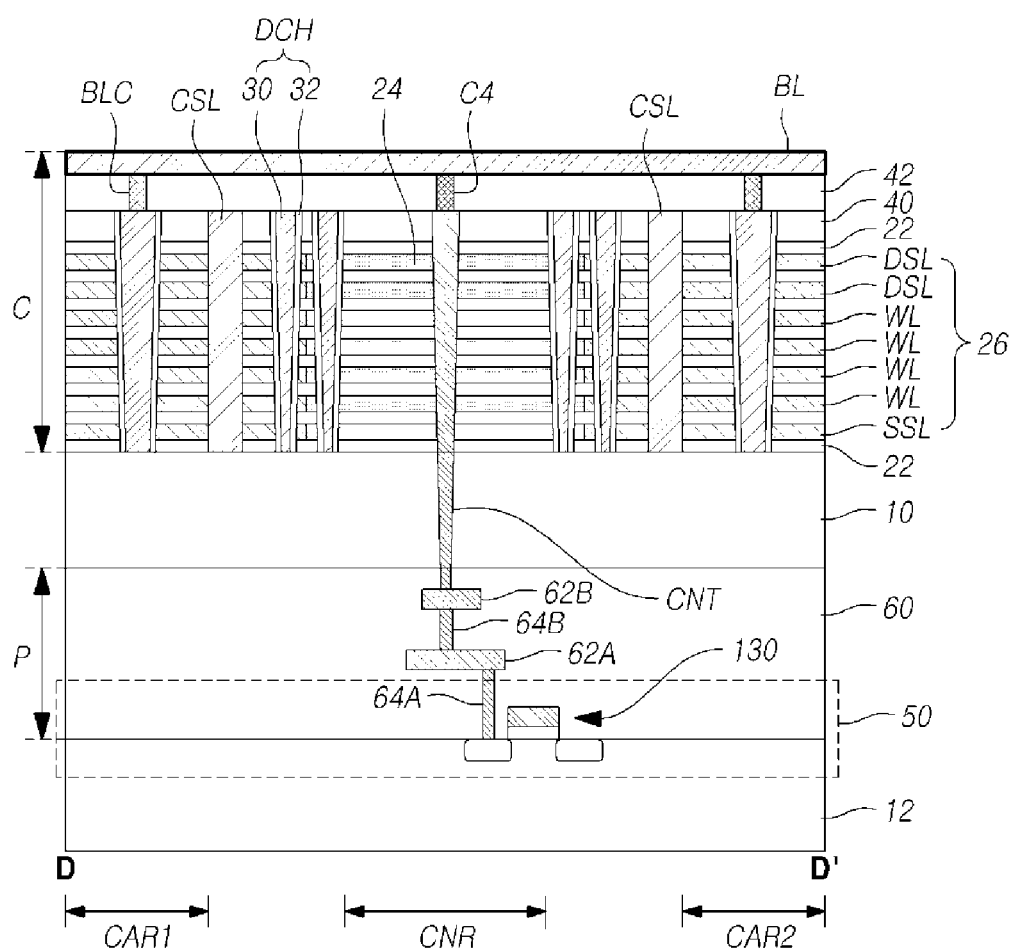
FIG. 9 is a cross-sectional view taken along the line D-D' of FIG. 8.

FIG. 8 is a top view illustrating an example of a semiconductor memory device in accordance an embodiment of the disclosure, and FIG. 9 is a cross-sectional view taken along the line D-D' of FIG. 8.

Referring to FIG. 8, a plurality of separation structures CSL may be defined in a stack SA, and thereby, may divide the stack SA into a plurality of blocks or/and a plurality of fingers. The separation structures CSL may extend in the first direction FD, and may be disposed in the second direction SD.

A first cell region CAR1 and a second cell region CAR2 may be disposed in the second direction SD. One block and a pair of separation structures CSL may be disposed between the first cell region CAR1 and the second cell region CAR2. A coupling region CNR may be disposed in the block between the first cell region CAR1 and the second cell region CAR2. The coupling region CNR may be defined as a region which is surrounded by a plurality of dummy channels DCH. The dummy channels DCH may be disposed along the periphery of the coupling region CNR, and may pass through the block between the first cell region CAR1 and the second cell region CAR2 in the vertical direction VD.

Referring to FIGS. 8 and 9, the semiconductor memory device may have a PUC structure. A logic structure P may be disposed under a memory structure C. The logic structure P may include a logic circuit 50 which is disposed on a second substrate 12. The logic circuit 50 may include a page buffer circuit 130 which is defined on the second substrate 12. FIGS. 8 and 9 illustrate a case where bit lines BL, which are defined in the memory structure C, are coupled to the page buffer circuit 130, which is defined in the logic structure P.

An interlayer dielectric layer 60 may be defined on the second substrate 12, and thereby, may cover the logic circuit 50. A wiring line 62B may be disposed in the interlayer dielectric layer 60. The wiring line 62B may be coupled to the page buffer circuit 130 through contacts 64A and 64B and a wiring line 62A.

The bit line BL of the memory structure C may be coupled to a contact plug CNT through a contact C4 which passes through a second interlayer dielectric layer 42. In the coupling region CNR, the contact plug CNT may be coupled to the wiring line 62B through a first interlayer dielectric layer 40, first and second dielectric layers 22 and 24 alternately stacked, and a substrate 10. The contact plug CNT may configure an electrical path which couples the bit line BL of the memory structure C and the page buffer circuit 130 of the logic structure P.

Figure 10:
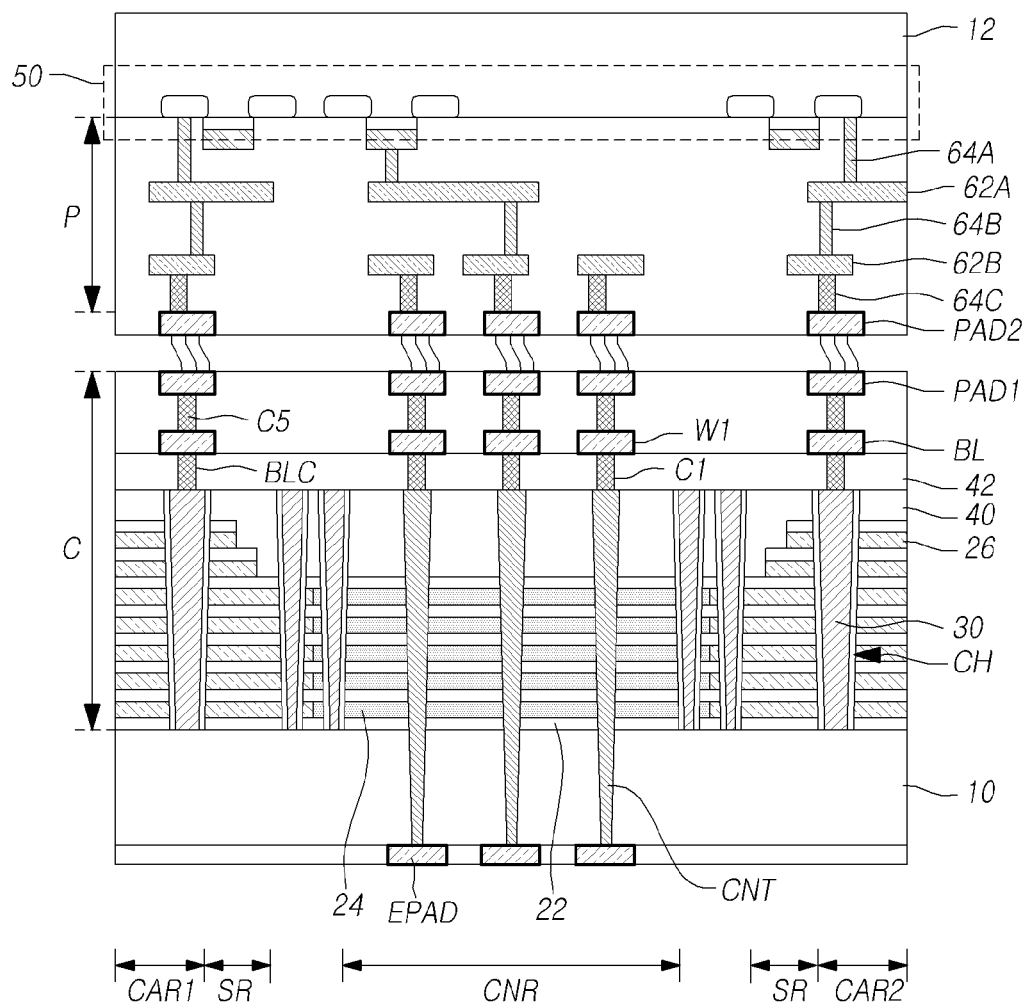
FIG. 10 is a cross-sectional view illustrating an example of a semiconductor memory device in accordance with an embodiment of the disclosure.

FIG. 10 is a cross-sectional view illustrating an example of a semiconductor memory device in accordance with an embodiment of the disclosure.

Referring to FIG. 10, the semiconductor memory device may have a POC (peri over cell) structure. A logic structure P may be disposed over a memory structure C. The memory structure C and the logic structure P may be separately fabricated and be then bonded with each other. The memory structure C may be fabricated on a first substrate 10. The logic structure P may be fabricated on a second substrate 12. The first substrate 10 and the second substrate 12 may be formed of the same material. The first substrate 10 and the second substrate 12 may each include at least one selected from the group including a monocrystalline silicon layer, an SOI (silicon on insulator), a silicon layer formed on a silicon germanium (SiGe) layer, a monocrystalline silicon layer formed on a dielectric layer and a polysilicon layer formed on a dielectric layer.

External pads EPAD may be disposed on the bottom surface of the first substrate 10. While not illustrated, a dielectric layer may be disposed between the bottom surface of the first substrate 10 and the external pads EPAD. In a coupling region CNR, a contact plug CNT may be coupled to one of the external pads EPAD through a first interlayer dielectric layer 40, first and second dielectric layers 22 and 24 alternately stacked, and the first substrate 10.

Bit lines BL and wiring lines W1 may be disposed on a second interlayer dielectric layer 42. Bit line contacts BLC which pass through the second interlayer dielectric layer 42 may be defined under the bit lines BL, and thereby, may couple the bit lines BL and channel layers 30 of channels CH. Contacts C1, which pass through the second interlayer dielectric layer 42 may be defined under the wiring lines W1, and thereby, may couple the wiring lines W1 and contact plugs CNT.

First pads PAD1 which are coupled to the bit lines BL and the wiring lines W1 through contacts C5, respectively, may be defined on one surface of the memory structure C. Second pads PAD2, which are coupled to a logic circuit 50 through wiring lines 62A and 62B and contacts 64A, 64B and 64C, may be defined on one surface of the logic structure P.

As the one surface of the memory structure C and the one surface of the logic structure P are bonded with each other, the first pads PAD1 of the memory structure C and the second pads PAD2 of the logic structure P may be coupled with each other. Accordingly, electrical paths are configured that couple the memory cells of the memory structure C and the logic circuit 50 of the logic structure P.

FIGS. 11A to 16A are examples of top views to assist in the explanation of a method for manufacturing a semiconductor memory device in accordance with an embodiment of the disclosure, according to a manufacturing sequence, and FIGS. 11B to 16B are cross-sectional views taken along the lines E-E' of FIGS. 11A to 16A, respectively.

Figure 11A:
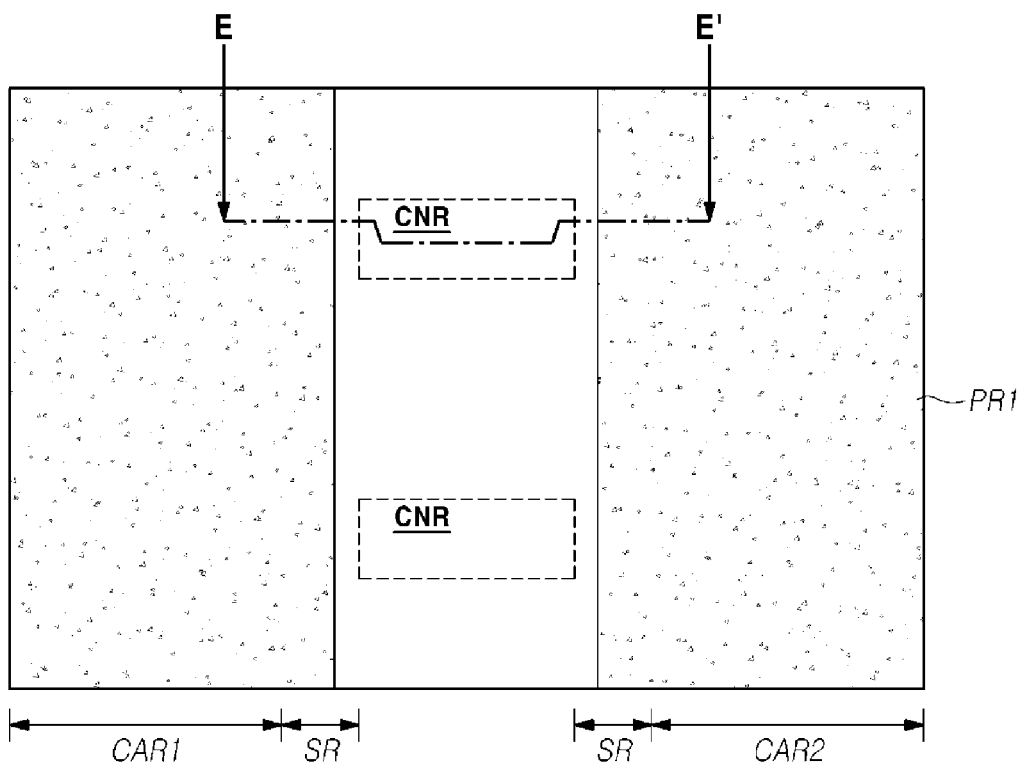
Figure 11B:
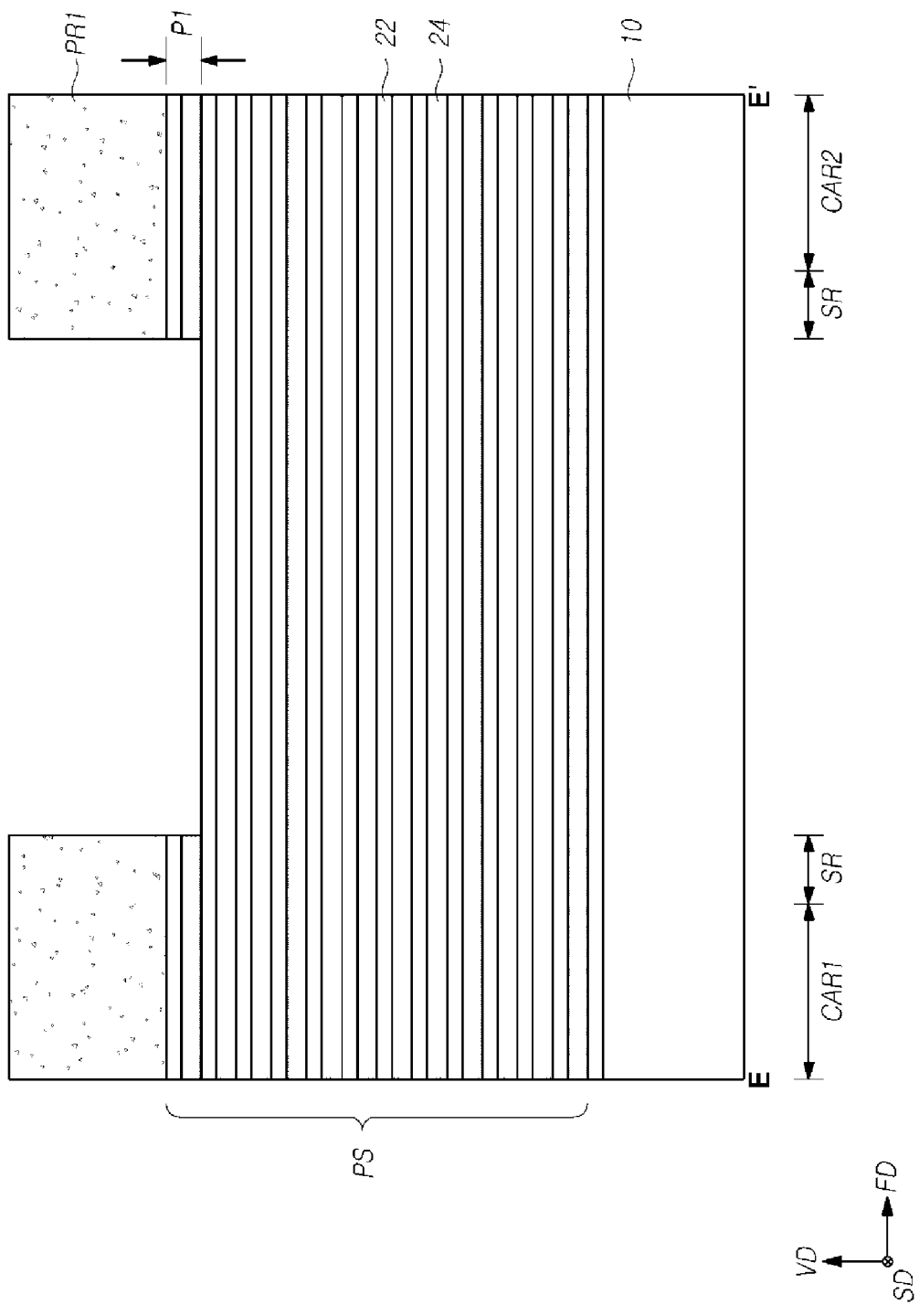

Referring to FIGS. 11A and 11B, first dielectric layers 22 and second dielectric layers 24 may be alternately stacked on a first substrate 10 which is defined with a cell region CAR, step regions SR and a coupling region CNR, and thereby, a pre-stack PS may be formed. The cell region CAR may include a first cell region CAR1 and a second cell region CAR2 which are disposed in the first direction FD. The step regions SR may be disposed adjacent to the first cell region CAR1 and the second cell region CAR2, respectively, and between the first cell region CAR1 and the second cell region CAR2. The coupling region CNR may be disposed between the two step regions SR.

The first dielectric layers 22 and the second dielectric layers 24 may be formed of different materials. For example, the first dielectric layers 22 may be formed of a dielectric material for interlayer insulation, and the second dielectric layers 24 may be formed of a dielectric material which may be used as sacrificial layers and has an etching selectivity with respect to the first dielectric layers 22. For example, the first dielectric layers 22 may be formed as silicon oxide layers, and the second dielectric layers 24 may be formed as silicon nitride layers.

A first mask pattern PR1 having an opening, which covers the first and second cell regions CAR1 and CAR2 and portions of the step regions SR and exposes the coupling region CNR, may be formed on the pre-stack PS.

The pre-stack PS may be etched by a pad etching process using the first mask pattern PR1 as an etch mask. An etching thickness of each cycle of the pad etching process may correspond to a vertical pitch P1 of the second dielectric layers 24. The vertical pitch P1 of the second dielectric layers 24 may be defined as the sum of the thickness of one of the second dielectric layers 24 and the thickness of one of the first dielectric layers 22.

Figure 12A:
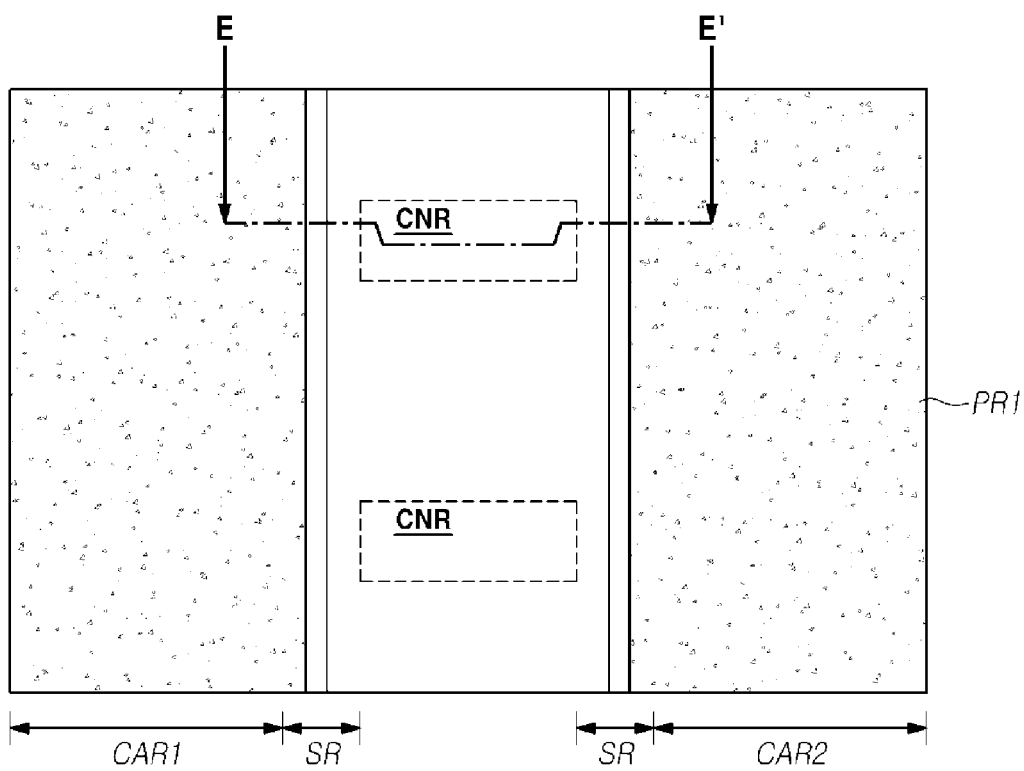

Referring to FIGS. 12A and 12B, a trimming process may be performed for the first mask pattern PR1. Namely, an isotropic etching process may be performed for the first mask pattern PR1. The trimming process may be performed using an etchant capable of removing the first mask pattern PR1. Accordingly, the height and width of the first mask pattern PR1 may be reduced. As the width of the first mask pattern PR1 is reduced, the width of the opening in the first mask pattern PR1 may be widened. The pad etching process and the trimming process may constitute one cycle for forming one step in each of the step regions SR.

Then, the pre-stack PS may be etched by a pad etching process using the trimmed first mask pattern PR1 as an etch mask. Accordingly, a step structure having two steps may be defined in each of the step regions SR. The second dielectric layers 24, which are etched by the pad etching processes, may be subsequently replaced with a conductive material, which may constitute drain select lines. While the present embodiment illustrates a case where two steps are formed, it is to be noted that the number of steps is not limited thereto. The number of steps may be changed depending on the stack number of drain select lines. The first mask pattern PR1 may be formed of a photoresist, and may be removed after the step structure is formed.

Figure 13A:
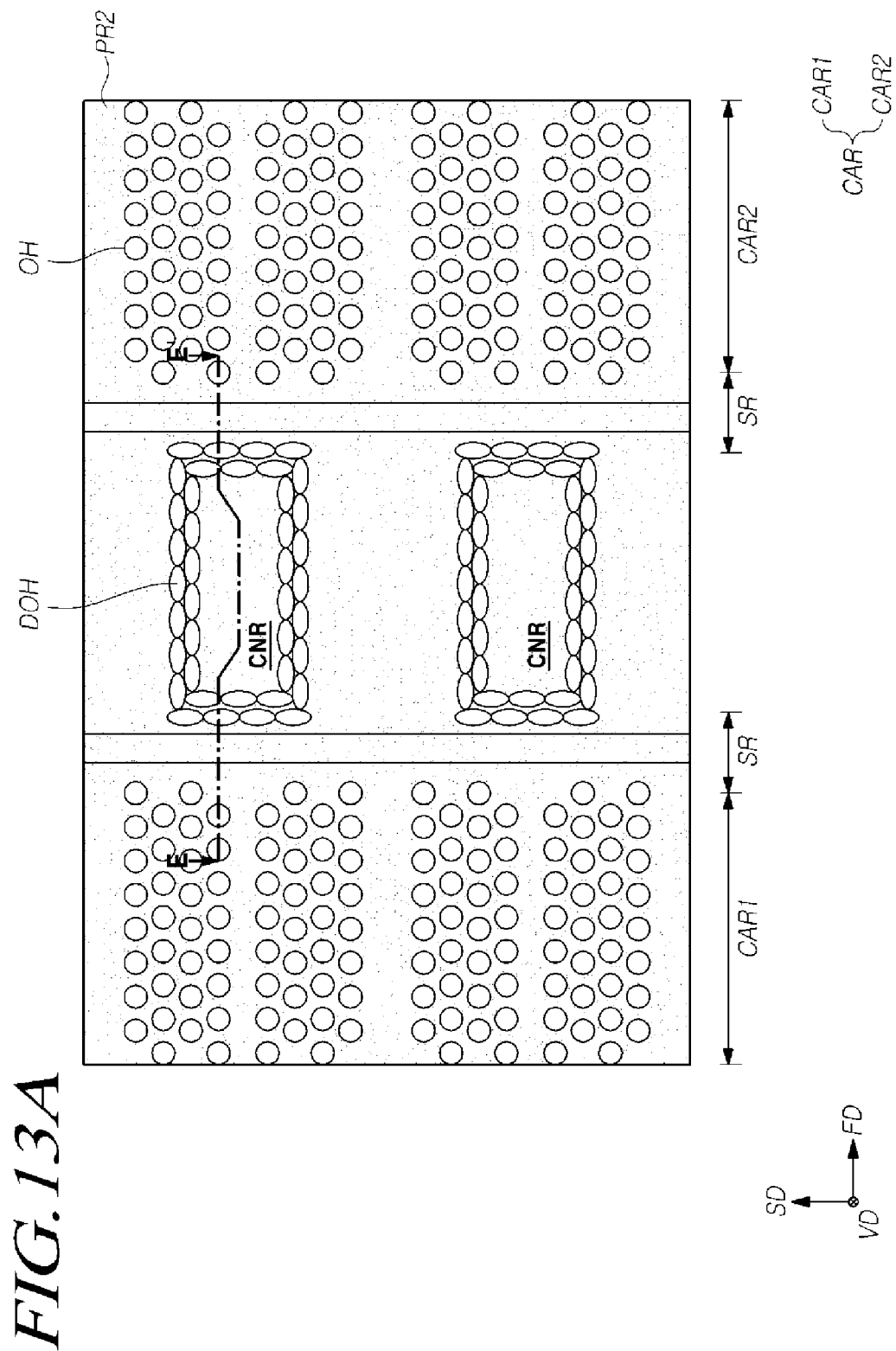
Figure 13B:
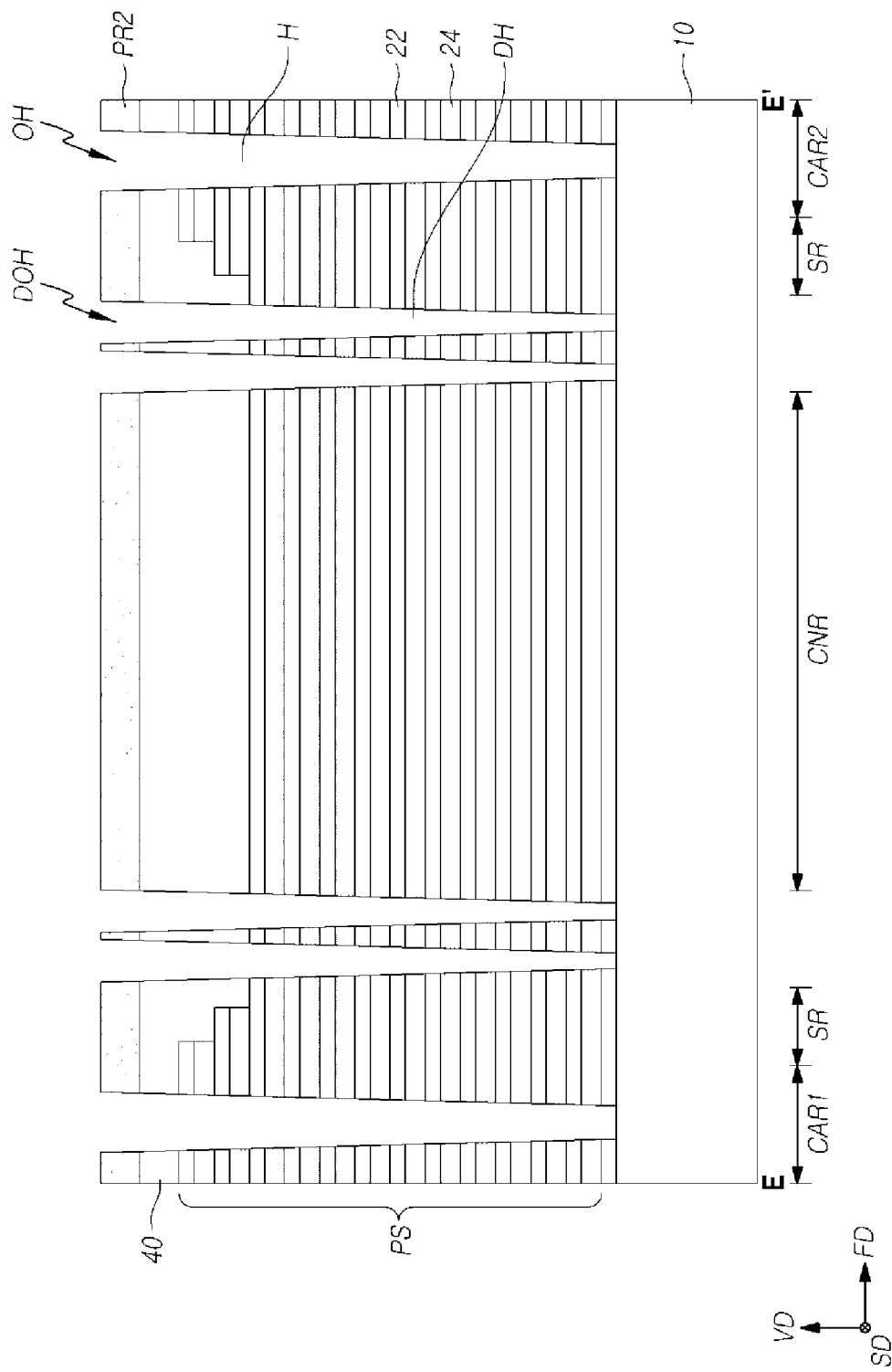
Figure 14A:
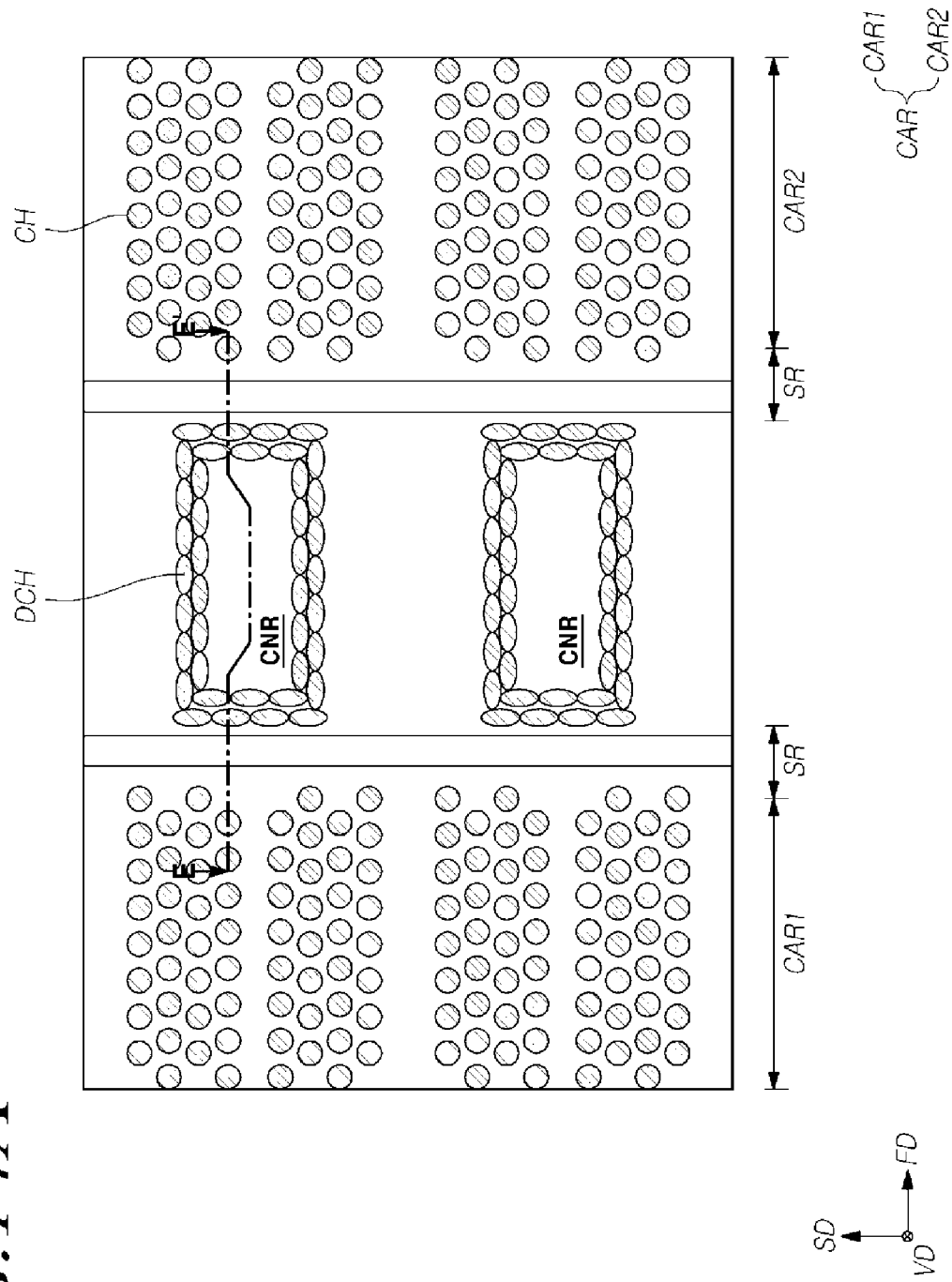

Referring to FIGS. 13A and 13B, a first interlayer dielectric layer 40 which covers the pre-stack PS may be formed. The first interlayer dielectric layer 40 may be formed as a silicon oxide layer.

A second mask pattern PR2 having a plurality of opening holes OH which expose the first interlayer dielectric layer 40 of the cell regions CAR1 and CAR2, and having a plurality of dummy opening holes DOH which expose the first interlayer dielectric layer 40 at the periphery of the coupling region CNR, may be formed on the first interlayer dielectric layer 40.

By etching the first interlayer dielectric layer 40 and the pre-stack PS by an etching process using the second mask pattern PR2 as an etch mask, a plurality of channel holes H may be formed in the cell regions CAR1 and CAR2, and a plurality of dummy channel holes DH may be formed at the periphery of the coupling region CNR.

The channel holes H may be separated from one another in the first direction FD and the second direction SD. The dummy channel holes DH may be disposed adjacent to one another while surrounding the coupling region CNR. The interval between the dummy channel holes DH may be smaller than the interval between the channel holes H. At the same height from the first substrate 10, the cross-sectional area of each dummy channel hole DH may be substantially the same as the cross-sectional area of each channel hole H. The second mask pattern PR2 may be formed of a photoresist, and may be removed after the channel holes H and the dummy channel holes DH are formed.

An etch speed may vary depending on the area of an object to be etched. This phenomenon is called a loading effect. That is to say, even though etching is performed using plasma of the same density, if the area of the object is different, then the density of the plasma supplied to the object may be different, and a difference in etch speed may occur due to a difference in plasma density.

Figure 17:
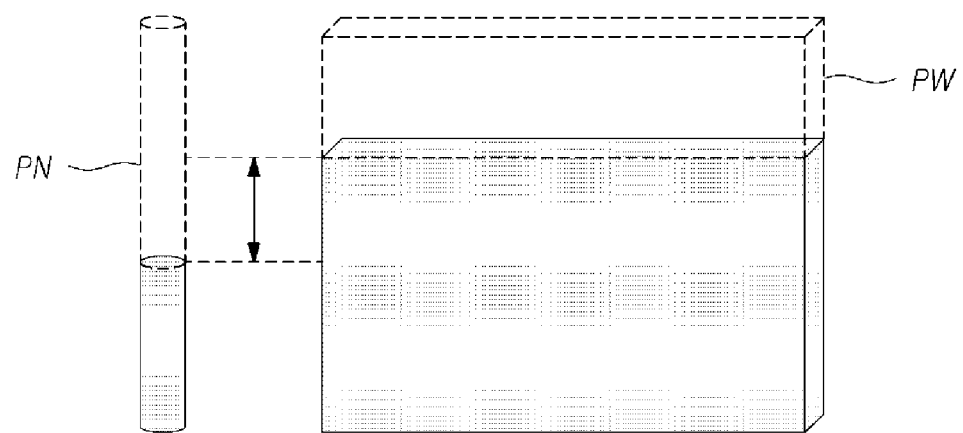
FIG. 17 is a representation to assist in the explanation of a difference in etch speed due to a loading effect.

FIG. 17 is a representation to assist in the explanation of a difference in etch speed due to a loading effect.

Referring to FIG. 17, in the case where patterns having different areas are simultaneously etched, a difference in etch speed may occur due to the loading effect. For example, an etch speed for a pattern PN having a narrower area may be faster than an etch speed for a pattern PW having a wider area. Such a difference in etch speed may result in a not-open failure or an over-etch failure.

Referring back to FIGS. 13A and 13B, in the present embodiment, since the planar area of the channel hole H and the planar channel of the dummy channel hole DH are substantially the same, the loading effect may be suppressed in the etching process for forming the channel holes H and the dummy channel holes DH, and thereby, it is possible to prevent the occurrence of an etch failure due to the loading effect.

Referring to 14A and 14B, a gate dielectric layer 32 and a channel layer 30 may be sequentially formed in the channel holes H and the dummy channel holes DH. The gate dielectric layer 32 and the channel layer 30 formed in the channel holes H may constitute channels CH. The gate dielectric layer 32 and the channel layer 30 formed in the dummy channel holes DH may constitute dummy channels DCH.

Referring to 15A and 15B, a plurality of slits SLT2, which divide the plurality of first and second dielectric layers 22 and 24 constituting the pre-stack PS into a plurality of blocks or a plurality of fingers, may be formed. Further, a plurality of slits SLT1 are formed, which divide the first and second dielectric layers 22 and 24 that are defined with the step structure, from among the plurality of first and second dielectric layers 22 and 24, into units smaller than the blocks or the fingers.

Next, a wet etching process for removing the second dielectric layers 24 may be performed. While the wet etching process is performed, an etchant capable of removing the second dielectric layers 24 may be injected through the slits SLT1 and SLT2.

Figure 18:
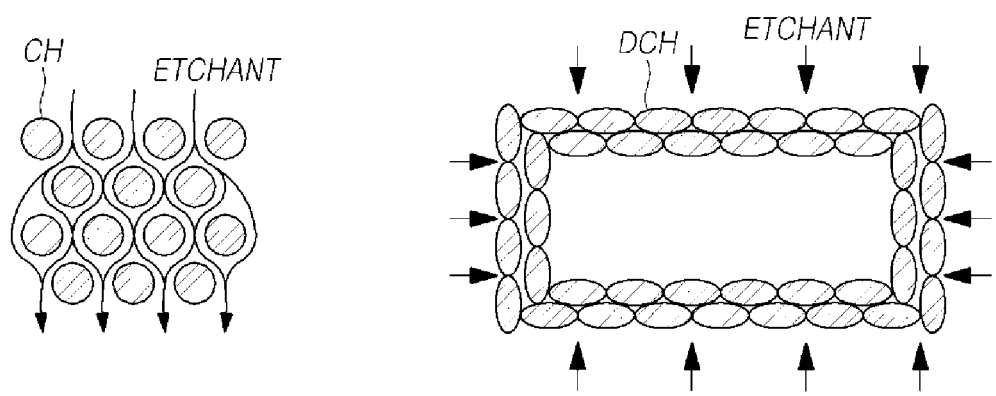
FIG. 18 is a representation to assist in the explanation of the flow of an etchant in a wet etching process for removing a second dielectric layer.

FIG. 18 is a representation to assist in the explanation of the flow of an etchant in a wet etching process for removing a second dielectric layer.

As illustrated in FIG. 18, because the interval between the channels CH is relatively wide, an etchant ETCHANT may infiltrate through the gaps between the channels CH. On the other hand, since the interval between the dummy channels DCH is relatively narrow, the etchant ETCHANT may not infiltrate, or is blocked from flowing, through the gaps between the dummy channels DCH.

Figure 15A:
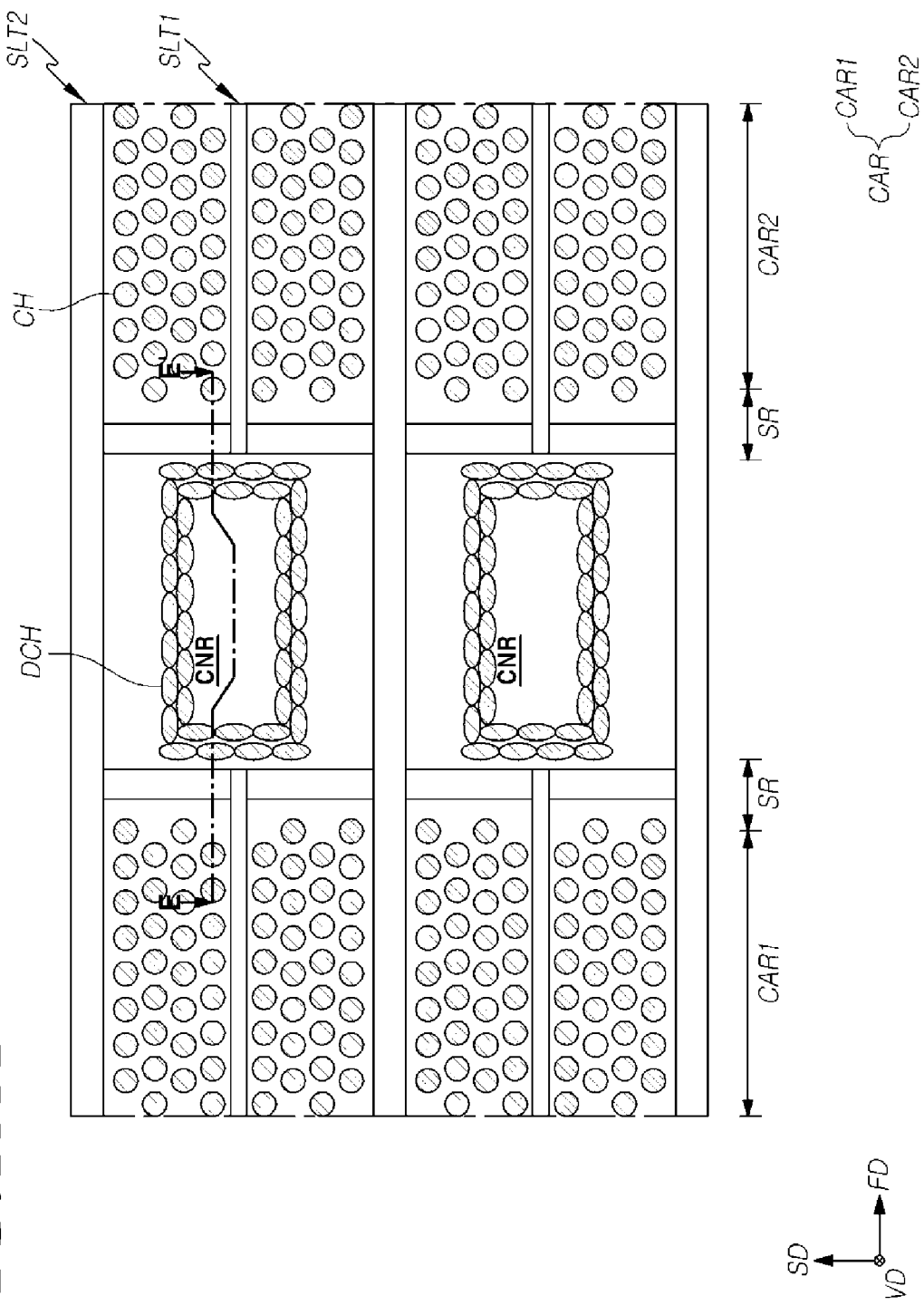
Figure 15B:
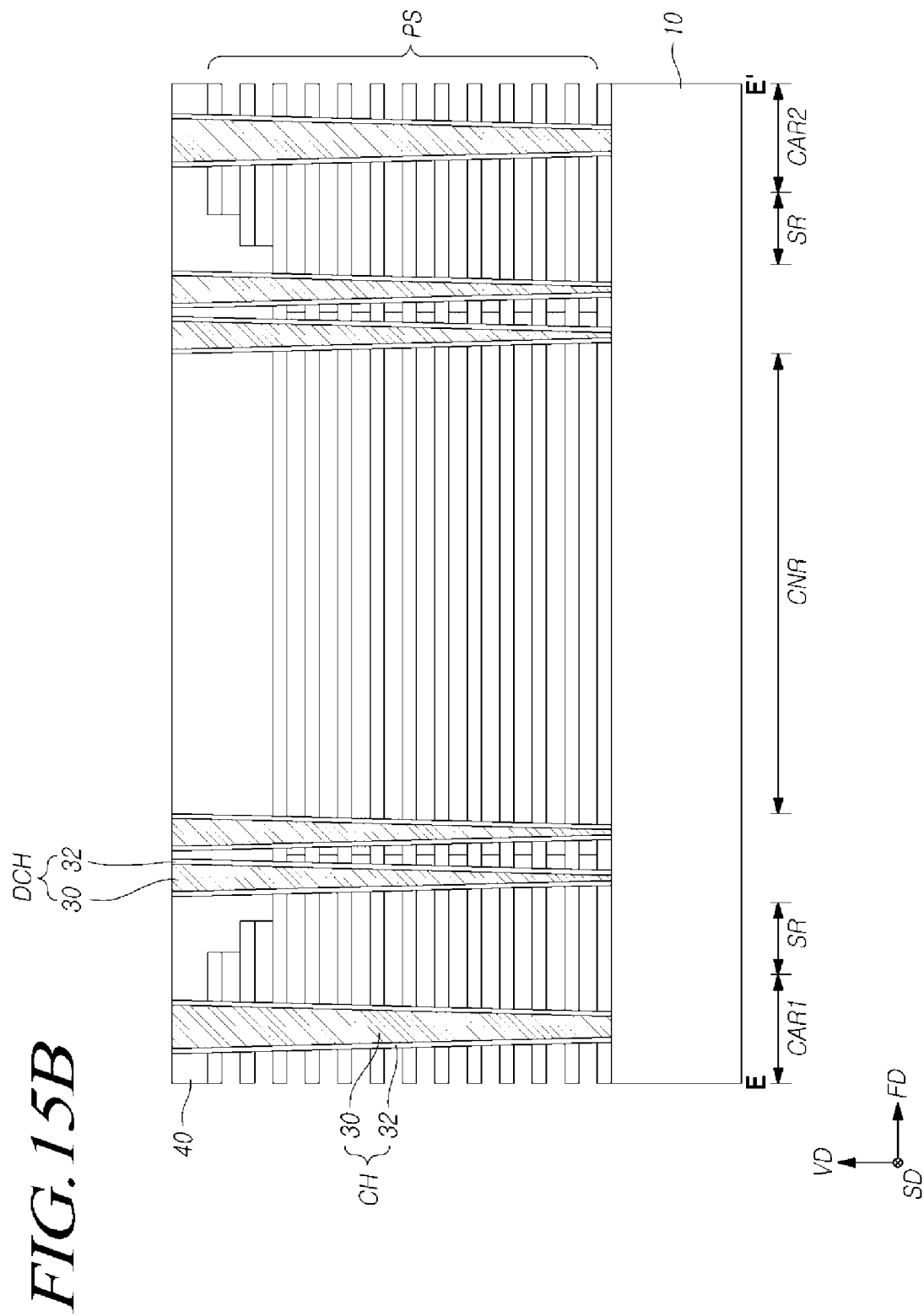

As a result, as illustrated in FIG. 15B, the second dielectric layers 24 inside the coupling region CNR surrounded by the dummy channels DCH may not be removed and remain, and the second dielectric layers 24 outside the coupling region CNR, including the first and second cell regions CAR1 and CAR2, may be removed.

Figure 16A:
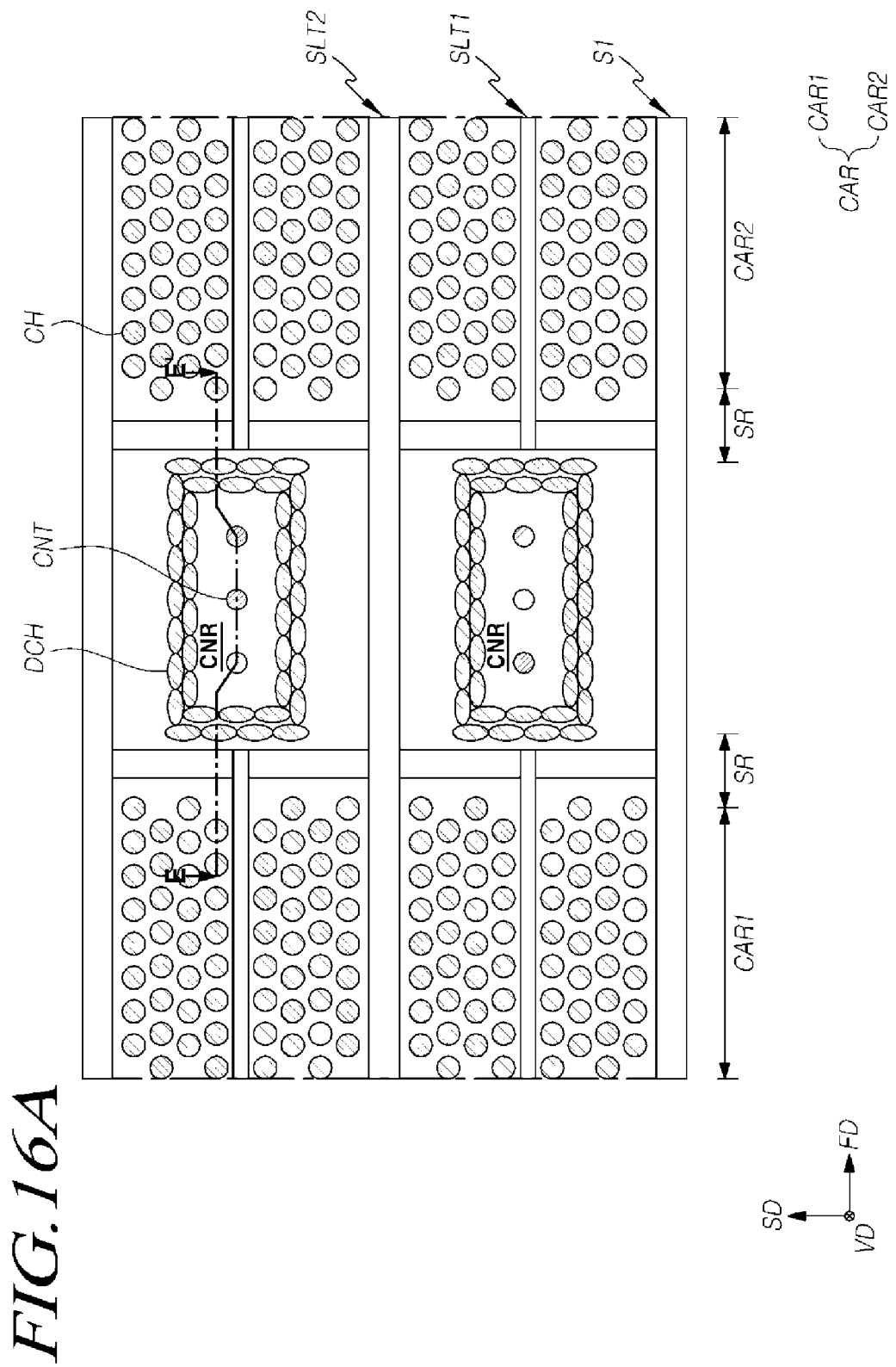
Figure 16B:
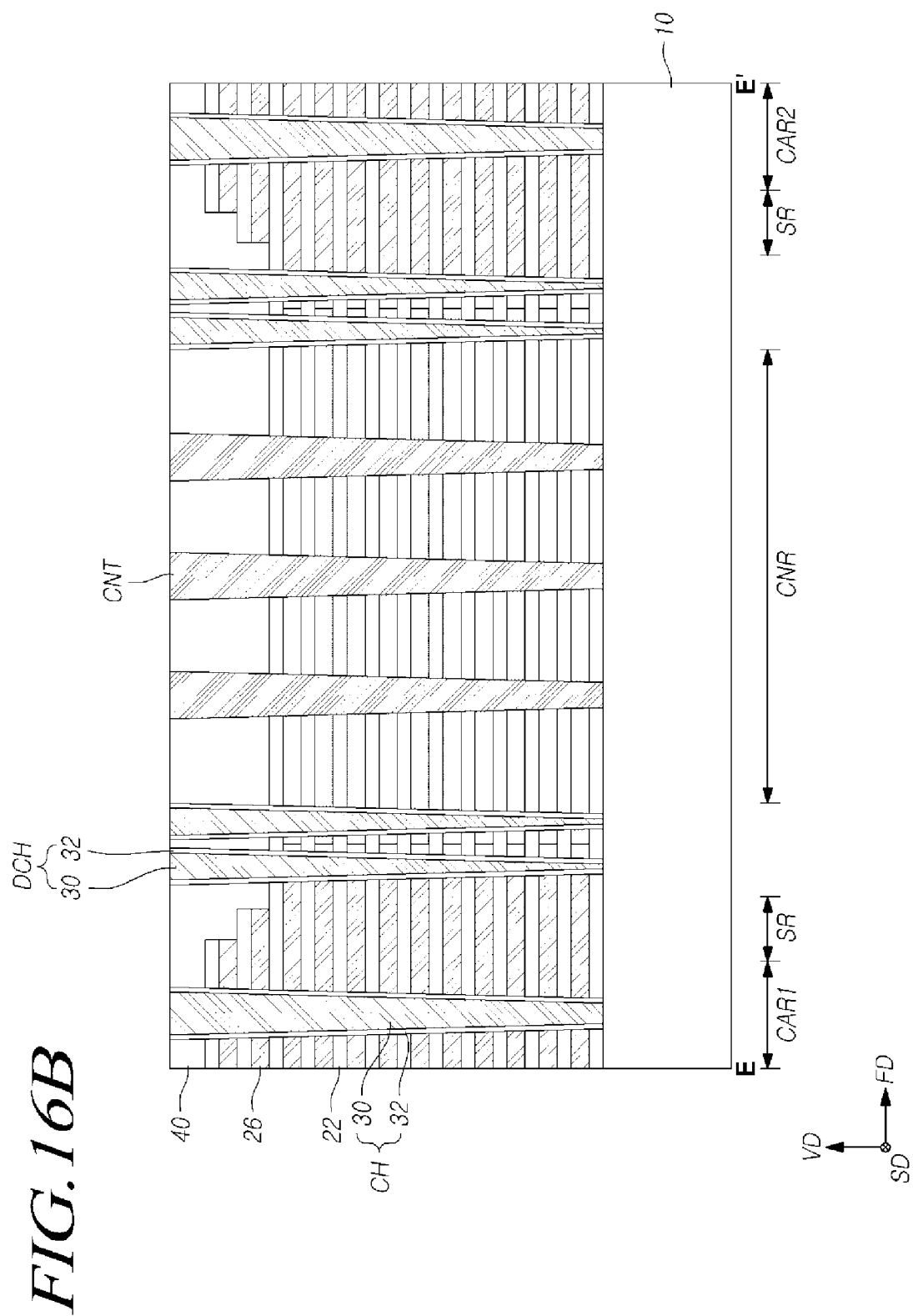

Referring to FIGS. 16A and 16B, by filling in spaces from which the second dielectric layers 24 are removed with a conductive material, electrode layers 26 may be formed. For example, the conductive material used as the electrode layers 26 may include at least one selected among a doped semiconductor (e.g., doped silicon), a metal (e.g., tungsten, copper or aluminum), a conductive metal nitride (e.g., titanium nitride or tantalum nitride) and a transition metal (e.g., titanium or tantalum).

Contact plugs CNT, which vertically pass through the first interlayer dielectric layer 40 and the first and second dielectric layers 22 and 24 of the coupling region CNR, may be formed. The first and second dielectric layers 22 and 24 of the coupling region CNR may provide spaces in which the contact plugs CNT are disposed.

As a result of market factors, buyers are highly sensitive to the price of semiconductor memory devices. Reducing the number of manufacturing steps in a manufacturing process is a very important factor in reducing a manufacturing time and manufacturing costs. Further, by simplifying the process through a reduction in the number of manufacturing steps, it is possible to reduce failures occurring during the manufacturing process.

According to the embodiments of the disclosure, the plurality of dummy channels DCH serving as an etch barrier may be formed in the process of forming the channels CH in the cell regions CAR1 and CAR2. Therefore, since separate manufacturing steps for forming an etch barrier may be omitted, a manufacturing time and a manufacturing cost may be reduced, and failures that occur during manufacturing processes may be reduced, thereby contributing to improvement in yield.

Because the dummy channels DCH serving as an etch barrier have substantially the same planar area as the channels CH, a loading effect may be reduced in a hole etching process for defining spaces for the formation of the channels CH and the dummy channels DCH, and thereby, it is possible to suppress a difference in etch speed due to the loading effect and a resultant etching failure.

Figure 19:
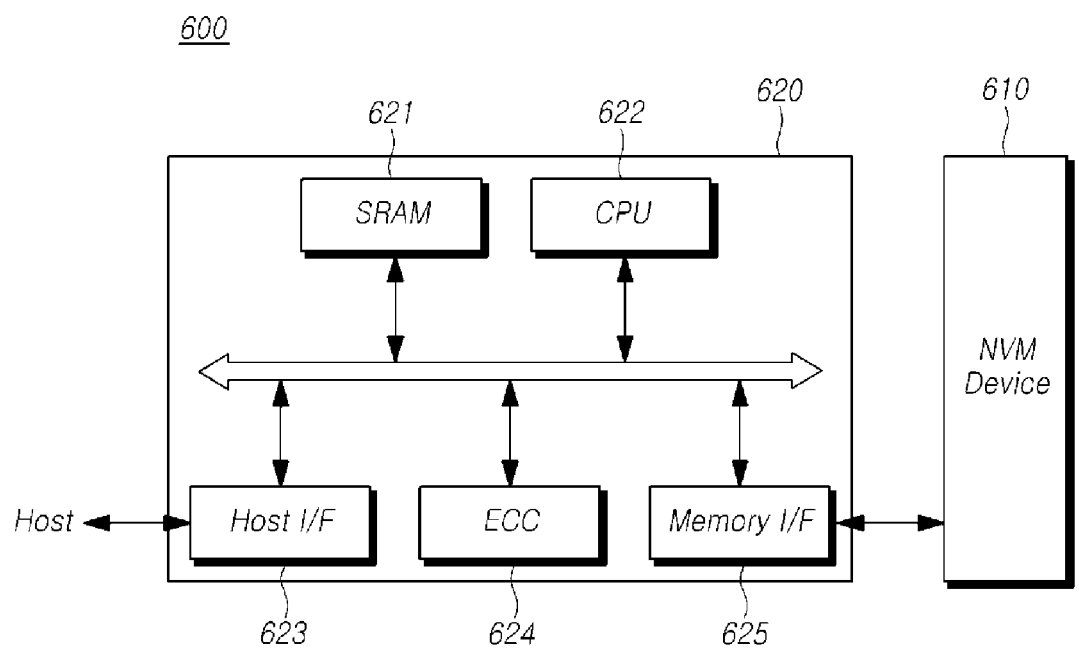
FIG. 19 is a diagram schematically illustrating an example of a memory system including a semiconductor memory device in accordance with an embodiment of the disclosure.

FIG. 19 is a block diagram schematically illustrating an example of a memory system including a semiconductor memory device in accordance with an embodiment of the disclosure.

Referring to FIG. 19, a memory system 600 in accordance with an embodiment may include a nonvolatile memory device 610 and a memory controller 620.

The nonvolatile memory device 610 may be constituted by a semiconductor memory device described above and may operate in the manner described above. The memory controller 620 may be configured to control the nonvolatile memory device 610. The combination of the nonvolatile memory device 610 and the memory controller 620 may be configured as a memory card or a solid state disk (SSD). An SRAM 621 is used as a working memory of a processing unit 622. A host interface 623 includes a data exchange protocol of a host which is coupled with the memory system 600.

An error correction code block 624 detects and corrects an error included in data read from the nonvolatile memory device 610.

A memory interface 625 interfaces with the nonvolatile memory device 610 of the present embodiment. The processing unit 622 performs general control operations for data exchange of the memory controller 620.

Although not shown in the drawing, it is obvious to a person skilled in the art to which the embodiment pertains that the memory system 600 in accordance with the embodiment may be additionally provided with a ROM which stores code data for interfacing with the host. The nonvolatile memory device 610 may be provided as a multi-chip package which is constituted by a plurality of flash memory chips.

The memory system 600 in accordance with the embodiment, described above, may be provided as a storage medium of high reliability, which has a low probability of an error to occur. In particular, the nonvolatile memory device of the present embodiment may be included in a memory system such as a solid state disk (SSD) which is being actively studied recently. In this case, the memory controller 620 may be configured to communicate with an exterior (for example, the host) through one of various interface protocols such as a USB (universal serial bus) protocol, an MMC (multimedia card) protocol, a PCI-E (peripheral component interconnection express) protocol, an SATA (serial advanced technology attachment) protocol, a PATA (parallel advanced technology attachment) protocol, an SCSI (small computer system interface) protocol, an ESDI (enhanced small disk interface) protocol and an IDE (Integrated Device Electronics) protocol.

Figure 20:
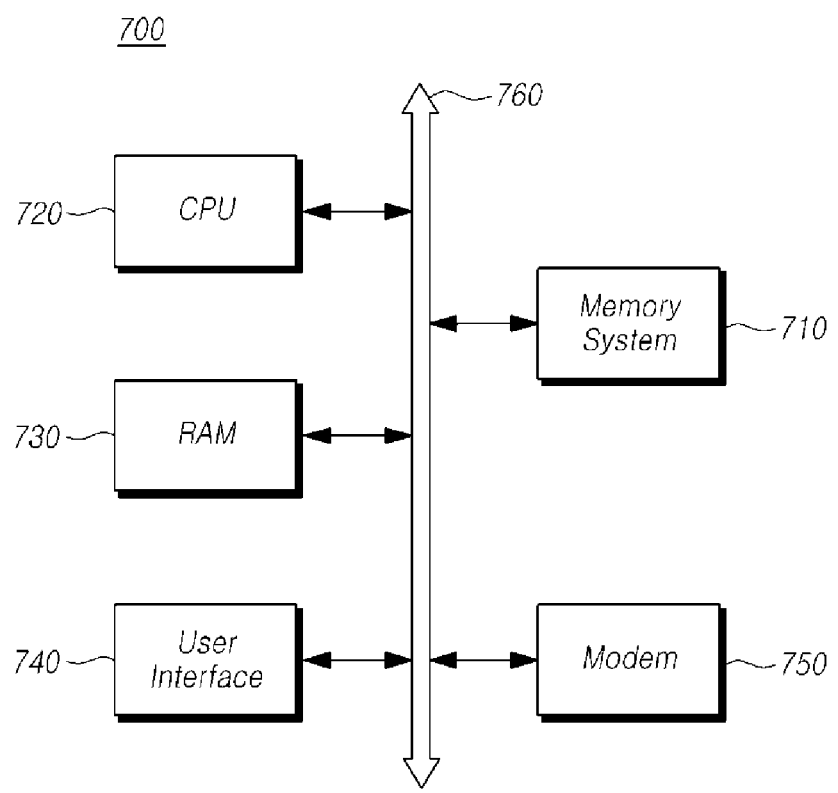
FIG. 20 is a block diagram schematically illustrating an example of a computing system including a semiconductor memory device in accordance with an embodiment of the disclosure.

FIG. 20 is a block diagram schematically illustrating an example of a computing system including a semiconductor memory device in accordance with an embodiment of the disclosure.

Referring to FIG. 20, a computing system 700 in accordance with an embodiment may include a memory system 710, a microprocessor 720, a RAM 730, a user interface 740 and a modem 750 such as a baseband chipset, which are electrically coupled to a system bus 760. In the case where the computing system 700 in accordance with the embodiment is a mobile device, a battery (not shown) for supplying the operating voltage of the computing system 700 may be additionally provided. Although not shown in the drawing, it is obvious to a person skilled in the art to which the embodiment pertains that the computing system 700 in accordance with the embodiment may be additionally provided with an application chipset, a camera image processor (CIS), a mobile DRAM, and so on. The memory system 710 may configure, for example, an SSD (solid state drive/disk) which uses a nonvolatile memory to store data. Otherwise, the memory system 710 may be provided as a fusion flash memory (for example, an OneNAND flash memory).

Although exemplary embodiments of the disclosure have been described for illustrative purposes, those skilled in the art will appreciate that various modifications, additions and substitutions are possible, without departing from the scope and spirit of the disclosure. Therefore, the embodiments disclosed above and in the accompanying drawings should be considered in a descriptive sense only and not for limiting the technological scope. The technological scope of the disclosure is not limited by the embodiments and the accompanying drawings. The spirit and scope of the disclosure may be interpreted in connection with the appended claims and encompass all equivalents falling within the scope of the appended claims.

What is claimed is:

1. A semiconductor memory device comprising:
    a stack disposed over a first substrate;
    an etch barrier consists of a plurality of dummy channels that pass through the stack and surround a coupling region; and
    a plurality of channels passing through the stack in a cell region outside the coupling region,
    wherein the stack consists of first dielectric layers and second dielectric layers alternately stacked inside the coupling region, and consists of the first dielectric layers and electrode layers alternately stacked outside the coupling region,
    wherein the plurality of dummy channels are spaced apart by a distance sufficient to prevent etchant from entering the coupling region.

2. The semiconductor memory device according to claim 1, wherein, in a top view, an area of each of the plurality of dummy channels is the same as an area of each of the plurality of channels.

3. The semiconductor memory device according to claim 1, wherein each of the plurality of channels and the plurality of dummy channels comprises:
   a channel layer disposed in a hole formed in and through the stack; and
   a gate dielectric layer surrounding an outer wall of the channel layer.

4. The semiconductor memory device according to claim 1, further comprising:
   a contact plug passing through the stack in the coupling region.

5. The semiconductor memory device according to claim 1, further comprising:
   a logic structure disposed between the first substrate and a second substrate below the first substrate, and including a logic circuit; and
   a contact plug passing through the stack and the first substrate in the coupling region, and coupled with the logic circuit.

6. The semiconductor memory device according to claim 1, further comprising:
   a plurality of bit lines disposed over the stack, and coupled to the plurality of channels through a plurality of bit line contacts;
   a first pad disposed over the plurality of bit lines, and coupled to one of the plurality of bit lines and the electrode layers;
   an external pad disposed over a bottom surface of the first substrate facing away from a top surface of the first substrate over which the stack is positioned;
   a contact plug coupling the first pad and the external pad by passing through the stack and the first substrate in the coupling region; and
   a logic structure including a logic circuit disposed over a second substrate and a second pad coupled with the logic circuit and bonded to the first pad.

7. The semiconductor memory device according to claim 1, further comprising:
   a plurality of bit lines disposed over the stack, extending in a second direction intersecting with a first direction, and coupled to the plurality of channels through a plurality of bit line contacts,
   wherein the cell region comprises a first cell region and a second cell region, which are disposed in the first direction, and the coupling region is disposed between the first cell region and the second cell region.

8. The semiconductor memory device according to claim 1, further comprising:
   a plurality of bit lines disposed over the stack, extending in a second direction intersecting with a first direction, and coupled to the plurality of channels through a plurality of bit line contacts,
   wherein the cell region comprises a first cell region and a second cell region, which are disposed in the second direction, and the coupling region is disposed between the first cell region and the second cell region.

9. A semiconductor memory device comprising:
   a stack disposed over a first substrate which is defined with a cell region and a coupling region;
   a plurality of channels passing through the stack in the cell region; and
   a plurality of dummy channels passing through the stack at a periphery of the coupling region,
   wherein an interval between the dummy channels is smaller than an interval between the channels, and
   wherein the stack comprises:
   a plurality of first dielectric layers stacked over the first substrate to be separated from one another;
   second dielectric layers stacked alternately with the first dielectric layers inside the coupling region; and
   electrode layers stacked alternately with the first dielectric layers outside the coupling region.

10. The semiconductor memory device according to claim 9, wherein, in a top view, an area of each of the plurality of dummy channels is the same as an area of each of the plurality of channels.

11. The semiconductor memory device according to claim 9, wherein each of the plurality of channels and the plurality of dummy channels comprises:
    a channel layer disposed in a hole formed in and through the stack; and
    a gate dielectric layer surrounding an outer wall of the channel layer.

12. The semiconductor memory device according to claim 9, further comprising:
    a contact plug passing through the stack in the coupling region.

13. The semiconductor memory device according to claim 9, further comprising:
    a logic structure disposed between the first substrate and a second substrate below the first substrate, and including a logic circuit; and
    a contact plug passing through the stack and the first substrate in the coupling region, and coupled with the logic circuit.

14. The semiconductor memory device according to claim 9, further comprising:
    a plurality of bit lines disposed over the stack, and coupled to the plurality of channels through a plurality of bit line contacts;
    a first pad disposed over the plurality of bit lines, and coupled to one of the plurality of bit lines and the electrode layers;
    an external pad disposed over a bottom surface of the first substrate facing away from a top surface of the first substrate over which the stack is positioned;
    a contact plug coupling the first pad and the external pad by passing through the stack and the first substrate in the coupling region; and
    a logic structure including a logic circuit disposed over a second substrate and a second pad coupled with the logic circuit and bonded to the first pad.

15. A method for manufacturing a semiconductor memory device, comprising:
    forming a pre-stack by alternately stacking a plurality of first dielectric layers and a plurality of second dielectric layers over a substrate that includes a cell region and a coupling region;
    forming a plurality of channel holes in the cell region and forming a plurality of dummy channel holes separated from one another with an interval smaller than an interval between the channel holes, at a periphery of the coupling region;
    forming a plurality of channels in the plurality of channel holes, and forming a plurality of dummy channels in the plurality of dummy channel holes;
    removing the second dielectric layers by using the plurality of dummy channels as an etch barrier such that the plurality of second dielectric layers inside the coupling region remain and the plurality of second dielectric layers outside the coupling region are removed; and forming electrode layers in spaces from which the plurality of second dielectric layers are removed outside the coupling region.

16. The method according to claim 15, wherein the forming of the plurality of channels and the plurality of dummy channels comprises sequentially forming a gate dielectric layer and a channel layer in the plurality of channel holes and the plurality of dummy channel holes.

17. The method according to claim 15, wherein, in a top view, an area of each of the plurality of dummy channel holes is the same as an area of each of the plurality of channel holes.

18. The method according to claim 15, further comprising:
forming a contact plug which passes through the plurality of first and plurality of second dielectric layers of the coupling region, after forming the electrode layers.

19. A semiconductor memory device comprising:
a stack disposed over a first substrate;
an etch barrier including a plurality of dummy channels that pass through the stack and surround a coupling region;
a plurality of channels passing through the stack in a cell region outside the coupling region;
a logic structure disposed between the first substrate and a second substrate below the first substrate, and including a logic circuit; and
a contact plug passing through the stack and the first substrate in the coupling region, and coupled with the logic circuit,
wherein the stack comprises first dielectric layers and second dielectric layers alternately stacked inside the coupling region, and comprises the first dielectric layers and electrode layers alternately stacked outside the coupling region,
wherein the coupling region is contacted with the plurality of dummy channels.

20. A semiconductor memory device comprising:
a stack disposed over a first substrate;
an etch barrier including a plurality of dummy channels that pass through the stack and surround a coupling region;
a plurality of channels passing through the stack in a cell region outside the coupling region;
a plurality of bit lines disposed over the stack, and coupled to the plurality of channels through a plurality of bit line contacts;
a first pad disposed over the plurality of bit lines, and coupled to one of the plurality of bit lines and the electrode layers;
an external pad disposed over a bottom surface of the first substrate facing away from a top surface of the first substrate over which the stack is positioned;
a contact plug coupling the first pad and the external pad by passing through the stack and the first substrate in the coupling region; and
a logic structure including a logic circuit disposed over a second substrate and a second pad coupled with the logic circuit and bonded to the first pad,
wherein the stack comprises first dielectric layers and second dielectric layers alternately stacked inside the coupling region, and comprises the first dielectric layers and electrode layers alternately stacked outside the coupling region,
wherein the coupling region is contacted with the plurality of dummy channels.

* * * * *